US008411320B2

(12) United States Patent
Takagaki et al.

(10) Patent No.: US 8,411,320 B2
(45) Date of Patent: Apr. 2, 2013

(54) IMAGE FORMING APPARATUS PERFORMING COLOR SHIFT CORRECTION PROCESS ON BINARY DATA

(75) Inventors: Susumu Takagaki, Saitama (JP); Hajime Misumi, Saitama (JP); Fujio Osawa, Saitama (JP); Kanou Saitou, Saitama (JP); Mitsunori Shioi, Saitama (JP); Takashi Kubo, Saitama (JP); Tadakazu Tsutehira, Saitama (JP); Yuji Sato, Saitama (JP); Hideo Kageyama, Saitama (JP)

(73) Assignee: Fuji Xerox Co., Ltd., Tokyo (JP)

( * ) Notice: Subject to any disclaimer, the term of this patent is extended or adjusted under 35 U.S.C. 154(b) by 806 days.

(21) Appl. No.: 12/553,427

(22) Filed: Sep. 3, 2009

(65) Prior Publication Data

US 2010/0231934 A1 Sep. 16, 2010

(30) Foreign Application Priority Data

Mar. 12, 2009 (JP) ................................ P2009-059545

(51) Int. Cl.
*G03F 3/08* (2006.01)
*H04N 1/46* (2006.01)

(52) U.S. Cl. .......... 358/1.9; 358/517; 358/518; 358/521

(58) Field of Classification Search ........................ None
See application file for complete search history.

(56) References Cited

U.S. PATENT DOCUMENTS

| | | | | |
|---|---|---|---|---|
| 2008/0198392 | A1 * | 8/2008 | Moriyama | 358/1.9 |
| 2008/0273902 | A1 | 11/2008 | Maeda | |
| 2009/0034033 | A1 * | 2/2009 | Takane | 358/518 |

FOREIGN PATENT DOCUMENTS

| | | |
|---|---|---|
| JP | A-08-069146 | 3/1996 |
| JP | A-2005-165220 | 6/2005 |
| JP | A-2006-030484 | 2/2006 |
| JP | A-2008-299311 | 12/2008 |

OTHER PUBLICATIONS

Matsuzaki Yoshiki; "Image forming apparatus . . . its control method"; JP Pub Date Feb. 2006; Machine translation of JP Pub No. 2006030484 in English.*

Japanese Office Action issued in Application No. 2009-059545; Dated Mar. 1, 2011 (With Translation).

* cited by examiner

*Primary Examiner* — Benny Q Tieu
*Assistant Examiner* — Haris Sabah
(74) *Attorney, Agent, or Firm* — Oliff & Berridge, PLC

(57) ABSTRACT

In the image forming apparatus, a color shift correction execution check unit detects positions of density correction patches of respective colors according to binary signals of density detection outputs by a density sensor on the density correction patches. When distances corresponding to intervals of time from starts of image drawing of the density correction patches of the respective colors to the detection of the positions of the density correction patches of the respective colors and distances between the density correction patches of the respective colors are shifted from a value, the color shift correction execution check unit determines color shift correction processing is required to be executed, and it gives an instruction to a color shift correction control unit to execute the color shift correction processing. And the color shift correction control unit forms a color shift correction patch to execute the color shift correction processing.

6 Claims, 15 Drawing Sheets

IMAGE FORMING APPARATUS PERFORMING COLOR SHIFT CORRECTION PROCESS ON BINARY DATA

CROSS-REFERENCE TO RELATED APPLICATIONS

This application is based on and claims priority under 35 USC 119 from Japanese Patent Application No. 2009-059545 filed on Mar. 12, 2009.

BACKGROUND

1. Technical Field

The present invention relates to an image forming apparatus.

2. Related Art

In an image forming apparatus such as a printer and a composite machine, a color image forming apparatus of a tandem type including multiple image forming units which respectively correspond to their associated color components has been developed.

Since this type of color image forming apparatus forms a color image while the toner images of the respective colors are superimposed on top of each other, in order to maintain the quality of the color image, the color image forming apparatus has a density correction control (a so called process control) function for correcting the toner densities of the respective colors and a color shift correction control (a so called resist control) function for correcting the shifted colors of the toner images of the respective colors.

Specifically, the density correction control function carries out the following control: that is, on an image carrier, there are formed the density correcting patches of the respective colors at given intervals; the densities of the respective patches are detected using a density sensor; and, when any lowered density is detected by the density sensor, there is executed a processing for maintaining the density of the image within a specified ranger for example, by supplying the toner of the color the toner density of which has been detected lowered.

Also, the color shift correction control function carries out the following control: that is, on an image carrier, there are formed color shift correcting patches for the respective colors at given intervals; the distances between the positions of the respective color shift correcting patches are measured according to the binary signal of the detect output from a density sensor; and, according to the measurement results, there is executed a color shift correcting processing.

SUMMARY

According to an aspect of the invention, an image forming apparatus includes: multiple image forming units respectively that forms images of different colors; a density correction image formation control unit that instructs the respective image forming unit to draw images for forming density correction images of the respective colors, transferring the formed density correction images of the respective colors onto an image carrier, and forming the density correction images of the respective colors on the image carrier; a density detecting unit that detects densities of the density correction images of the respective colors formed on the image carrier; a density correction control unit that corrects densities of images of the respective colors based on density detection outputs by the density detecting unit on the density correction images of the respective colors; a color shift correction execution check unit that detects positions of the density correction images of the respective colors based on first binary signals of the density detection outputs by the density detecting unit on the density correction images of the respective colors, and also checks, based on the detection by the color shift execution check unit, whether a color shift correction processing is required to be executed or not; a color shift correction image formation control unit that, when the color shift correction execution check unit determines that the color shift correction processing is required to be executed, that instructs the respective image forming units to draw images for forming color shift correction images of the respective colors, transferring the formed color shift correction images of the respective colors onto an image carrier, and forming the color shift correction images of the respective colors on the image carrier; and, a color shift correction control unit that detects positions of the color shift correction images of the respective colors based on second binary signals of density detection outputs by the density detecting unit on the color shift correction images of the respective colors, and also corrects color shifts based on the detection by the color shift correction control unit.

BRIEF DESCRIPTION OF THE DRAWINGS

Exemplary embodiment(s) of the present invention will be described in detail based on the following figures, wherein.

DETAILED DESCRIPTION

Figure 1:
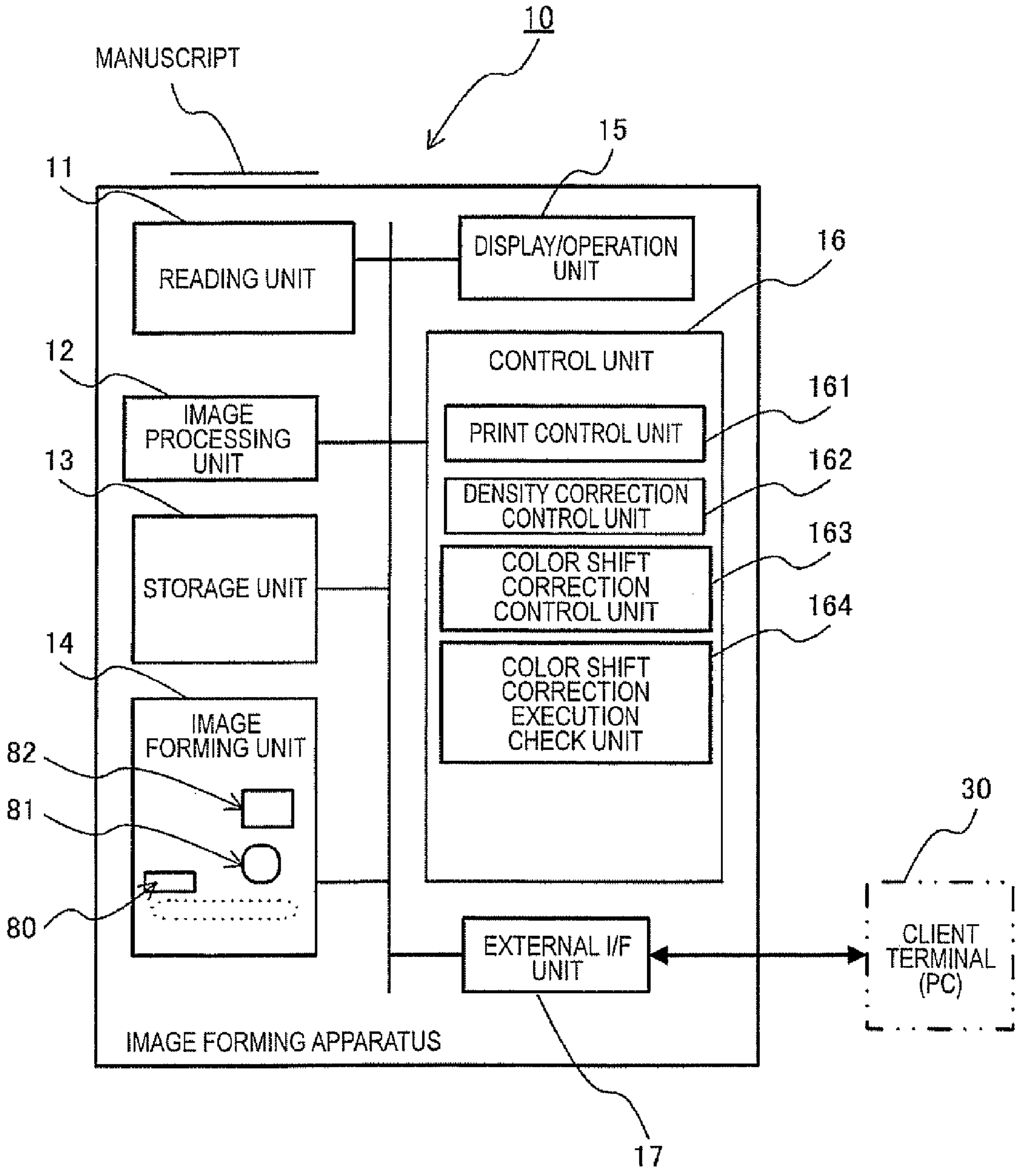
FIG. 1 is a block diagram of the function structure of an image forming apparatus according to the invention.

FIG. 1 is a block diagram of the function structure of an image forming apparatus 10 according to the invention.

This image forming apparatus 10 is assumed to be used as a composite machine. Specifically, it includes: a reading unit (a scanner unit) 11 for reading the image of a manuscript to be placed at a reading position (on a platen) and converting the image to an electric image signal (image data); an image processing unit 12 for executing an image processing on the image data obtained by reading and scanning the manuscript by the reading unit 11 and also on image data input from external equipment (in this example, a client terminal 30 which is realized by a personal computer) such as a personal computer; a storage unit 13 for storing various pieces of information such as image data and operation programs; an image forming unit 14 for executing an electro photographic process according to the image data (print data) image processed by the image processing unit 12 to thereby form (print) an image corresponding to the print data on a recording medium (a recording sheet which is hereinafter referred to as a sheet); a display/operation unit 15 including a large-size bit map display having a touch panel function, or the like; a control unit 16 for controlling the whole of the apparatus, that is, for controlling operations to be executed by the respective units of the apparatus involved with the respective functions such as a manuscript reading (scanning) function, a copying function, a printing function, and a facsimile (FAX) communication function; and, an external interface (I/F) unit 17 serving as a communication interface between external equipment and the apparatus.

In the image forming apparatus 10, the control unit 16 has a control function (a print control unit 161) which controls the image processing unit 12 to image process the manuscript image data read by the reading unit 11 and image data input from external equipment through the external I/F unit 17 to generate the print data (image signals), and also which, according to the thus generated print data, controls the image forming unit 14 to print the image on the sheet and output the thus printed image.

Figure 2:
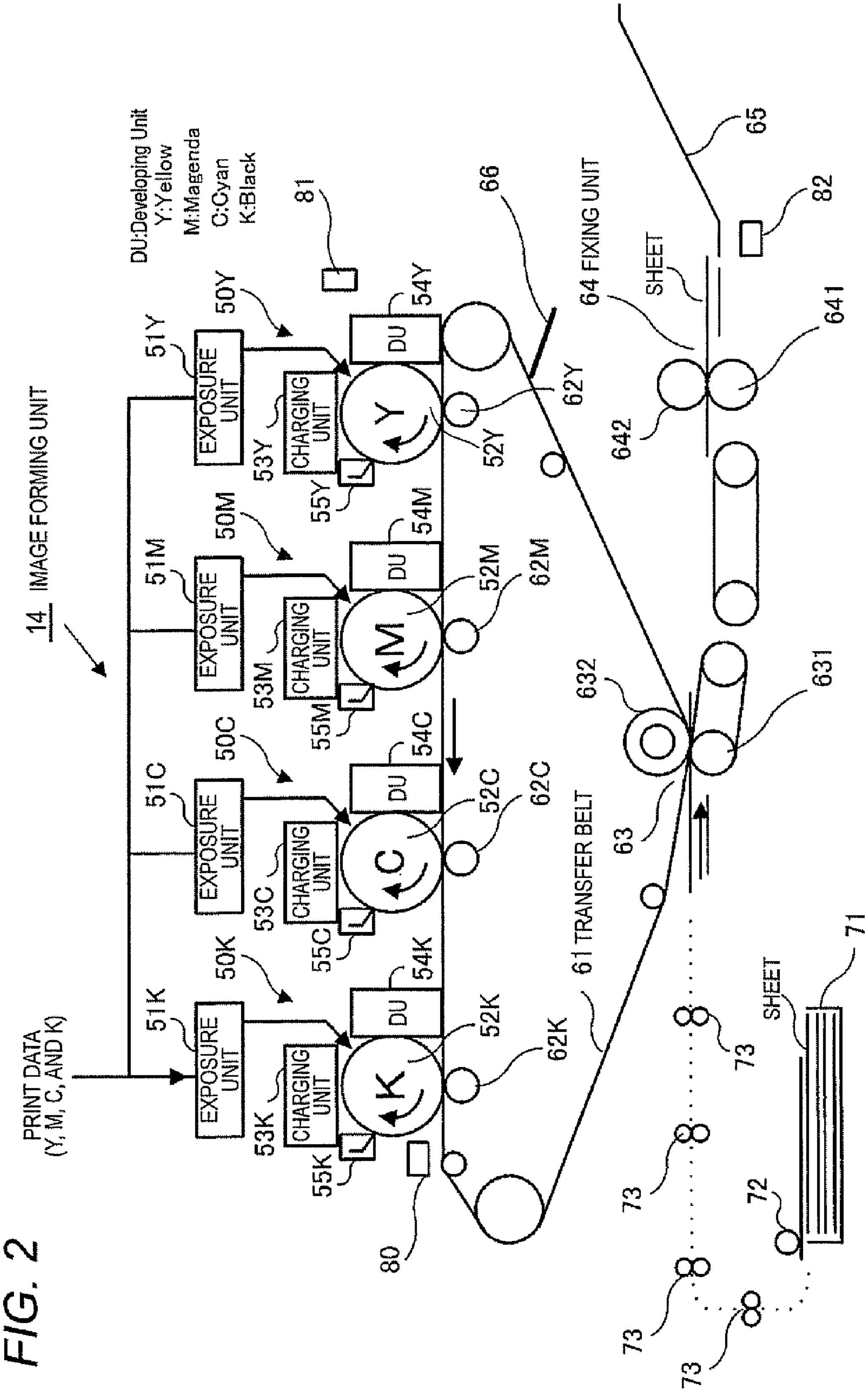
FIG. 2 is a structure view of an image forming unit included in the image forming apparatus.

The image forming unit 14, for example, as shown in FIG. 2, includes image forming units 50Y, 50N, 50C and 50K which respectively form the color images (toner images) of yellow (Y), magenta (M), cyan (C) and black (K) using color toners (Y), (M), (C) and (K) respectively corresponding to yellow (Y), magenta (M), cyan (C) and K (black).

The image forming units 50Y, 50M, 50C and 50K respectively include: exposure units 51Y, 51M, 51C and 51K which, according to the image signals (print data) of the color components (a Y component, an M component, a C component, and a K component) respectively input from the image processing unit 12 and corresponding to the respective units, expose the images using a laser beam; sensitive drums 52Y, 52M, 52C and 52K serving as image carriers on which, due to the above image exposure, there are formed electrostatic latent images corresponding to the image signals of the respective color components; charging units 53Y, 53K, 53C and 53K which, before the electrostatic latent images are formed, charge the peripheral surfaces of the sensitive drums 52Y, 52M, 52C and 52K; developing units 54Y, 54M, 54C and 54K which store therein the toners of the respective different colors (C, M, Y and K) and supply the toners of the corresponding colors to the electrostatic latent images formed on the sensitive drums 52Y, 52M, 52C and 52K to thereby form the toner images of the respective colors; and, drum cleaner units 55Y, 55M, 55C and 55K which scratch down residual toners on the sensitive drums 52Y, 52M, 52C and 52K after the toner images of the respective colors are transferred to a transfer belt 61 (which will be discussed later) to thereby clean the peripheral surfaces of the sensitive drums 52Y, 52M, 52C and 52K.

Also, the image forming unit 14 includes: an intermediate transfer belt (which is hereinafter referred to as a transfer belt and also which is an example of an image carrier) 61 for multiple transferring (primarily transferring) sequentially the toner images of the respective colors developed by the developing units 54Y, 54M, 54C and 54K; belt convey rollers 62Y, 62M, 62C and 62K disposed correspondingly to their associated sensitive drums 52Y, 52M, 52C and 52K of the image forming units 50Y, 50M, 50C and 50K for conveying the belt 61 around them in the arrow mark direction; a transfer unit 63 for transferring (secondarily transferring) the toner images, which have been multiple transferred onto the transfer belt 61 conveyed by the belt convey rollers 62Y, 62M, 62C and 62K, to sheets which, as will be discussed later, are fed one by one from a sheet feed cassette 71 by a sheet feed roller 72 and are then conveyed through a sheet convey route by multiple convey rollers 73; a fixing unit 64 for passing therethrough the sheets with the toner images transferred thereon while the sheets are held by and between a heating roller 641 and a pressurizing roller 642 to thereby fix the toner images on the sheets; a sheet discharge tray 65 for discharging the sheets on which the toner images have been fixed by the fixing unit 64; a cleaning blade 66 for scraping down toners left on the transfer belt 61 after the toner images are transferred (secondarily transferred) by the transfer unit 63; a density sensor 80 for detecting the densities of the respective color toner images (density correction images) which are formed on the transfer belt 61 in a density correction mode (which will be discussed later) and are used to control the correction of the densities of the toner images; a temperature sensor 81 disposed at a proper position near to the image forming units 50Y, 50M, 50C and 50K for detecting the temperature of the inside of the apparatus; and, a print volume counting unit 82 for counting a print volume (the volume of an A4 size or smaller is counted as 1 PV; for example, the volume of an A3 is counted as 2 PV) including a print number and a print size.

In the image forming unit 14, the transfer belt 61 is arranged such that it is allowed to pass through between the sensitive drum 52Y and belt convey roller 62Y, between the sensitive drum 52M and belt convey roller 62M, between the sensitive drum 52C and belt convey roller 62C, and between the sensitive drum 52K and belt convey roller 62K, as well as, through between a convey roller 631 and a driven roller 632 constituting the transfer unit 63.

And, in a normal print operation to be carried out according to an image signal (print data) which is input from the image forming unit 12, in a state where the convey roller 631 of the transfer unit 63 is pressed against the driven roller 632, the belt convey rollers 62Y, 62M, 62C, 62K and 631 are rotated to rotate the transfer belt 61 in the arrow mark direction, thereby carrying out an electro photographic process.

According to the present image forming apparatus 10, the control unit 16, as described above, includes not only the print control unit 161 for controlling the formation (printing) of a color image through the multiple transfer of the respective color toner images but also, as a control function to maintain the print quality of the color image, a density correction control unit 162 for controlling the correction of the densities of the respective color toners, a color shift correction control unit 163 for controlling the correction of the position shift (color shift) of the respective color toner images, and a color shift correction execution check unit 164 for checking whether the color shift correction control of the respective color toner images should be carried out or not.

Figure 3:
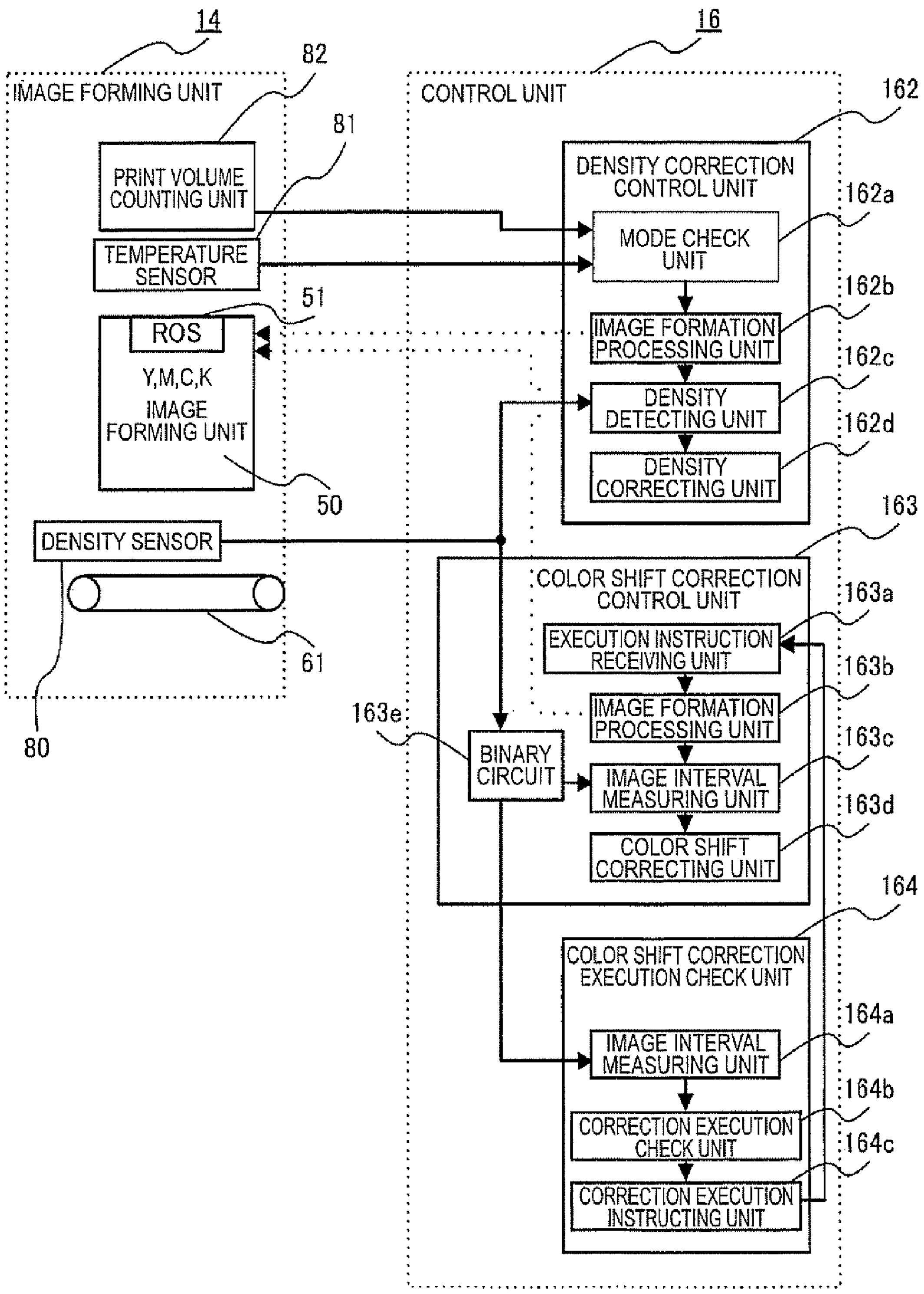
FIG. 3 is a schematic structure view of a control system employed in the image forming apparatus.

In FIG. 3, there is shown a schematic structure of a control system which realizes the density correction control, color shift correction control and color shift correction execution check control of the image forming apparatus 10.

According to the structure of the control system shown in FIG. 3, the detect output of the density sensor 80 provided in the image forming unit 14 is input to the density detecting unit 162*c* of the density correction control unit 162.

Also, the detect output of the density sensor 80 is turned into a binary value, for example, by a binary circuit 163*e* provided within the color correction control unit 163; and, the binary detect output is input to the image interval measuring unit 163*c* of the color correction control unit 163 and also to the image interval measuring unit 164*a* of the color shift correction execution check unit 164.

The detect output of the temperature sensor 81 and the output of the print volume counting unit 82, which are both provided within the image forming unit 14, are input to the mode check unit 162*a* of the density correction control unit 162.

In the control unit 16, the density correction control unit 162, when the mode check unit 162*a* recognizes that the temperature detected by the temperature sensor 81 and the print volume counted by the print volume counting unit 82 satisfy the start condition of the density correction mode, starts a density correction control mode; the image formation processing unit 162*b* of the density correction control unit 162 controls the image forming processes of the respective color image forming units 50Y, 50M, 50C and 50K respectively to form images (draw images) for controlling the density correction of the respective colors (density correction images which are hereinafter referred to as density correction patches); the density correction patches are transferred onto the transfer belt 61 to form on the transfer belt 61 the density correction patches of the respective colors which are arranged at given intervals in the convey direction of the transfer belt 61; the density detect unit 162*c* detects the densities of the respective color density correction patches on the transfer belt 61 from the detect outputs of the density sensor 80; and, when it is detected that the density of a given color is abnormal (beyond a specified range (the density is thin)), the density correcting unit 162*d* of the density correction control unit 162 supplies the toner of the relevant color to the toner storage unit of the developing unit 54 of the relevant color image forming unit 50, whereby the density correction control unit 162 carries out such a density correction processing that the density of the toner image of the relevant color can provide a value within the specified range.

In the color shift correction control unit 163, when the color shift correction control unit 163*a* thereof receives a correction execution instruction issued when the color shift correction execution check unit 164 determines that a color shift correction should be carried out according to a method which is discussed later, a color shift correction mode is started; the image formation processing unit 163*b* of the color shift correction control unit 163 controls the image forming processes of the respective color image forming units 50Y, 50M, 50C and 50K to form (draw) images for controlling the correction of the color shifts of the respective colors (color shift correction images which are hereinafter referred to as color shift correction patches); the color shift correction patches are transferred onto the transfer belt 61 to thereby form on the transfer belt 61 the color shift correction patches of the respective colors which are arranged at given intervals in the convey direction of the transfer belt 61; according to the binary signals (outputs of the binary circuit 163*e*) of the density detect outputs of the density sensor 80 for the color shift correction patches of the respective colors on the transfer belt 61, the image interval measuring unit 163*c* measures the distance between the color shift correction patches of the respective colors; and, when the measured distance is beyond a previously set distance (a specified range), the color shift correcting unit 163*d* of the color shift correction control unit 163, for example, adjusts the scanning angle of an exposure system employed in the exposure unit 51 of the image forming unit 50 involved with the relevant color, thereby carrying out the color shift correction control so that the distance between the color shift correction patches of the respective colors can be within the specified range.

In the color shift correction execution check unit 164, the image interval measuring unit 164*a* detects not only the time, which extends from the start of the drawing of the density correction patches of the respective colors formed on the transfer belt 61 in the above-mentioned density correction mode to the detection of the read positions of the density correction patches of the respective colors (which can be detected from the binary signals of the density sensor 80 (the outputs of the binary circuit 163*e*) (the time may also be converted to the distance, for example, using the convey speed of the transfer belt 61 and thus the time will be hereinafter explained as "distance"), but also the position intervals between the density correction patches of the respective colors (which can be detected from the binary signals of the density sensor 80; according to whether any one of the thus detected distances from the start of the drawing of the density correction patches of the respective colors to the detection of the read positions of the density correction patches of the respective colors and the position intervals of the density correction patches of the respective colors is beyond or within the previously set specified range, the correction execution check unit 164*b* of the color shift correction execution check unit 164 checks whether a color shift correction mode should be carried out or not; and, when it is determined that the color shift correction mode should be carried out, the correction execution instruction unit 164*c* of the color shift correction execution check unit 164 instructs the color shift correction control unit 163 to carry out a color shift correction mode (carry out the correction of the shifted color).

Now, description will be given below of the operation control in the density correction mode and color shift correction mode of the image forming apparatus 10 according to the invention with reference to the exemplary embodiments of the invention.

Exemplary Embodiment 1

Figure 4:
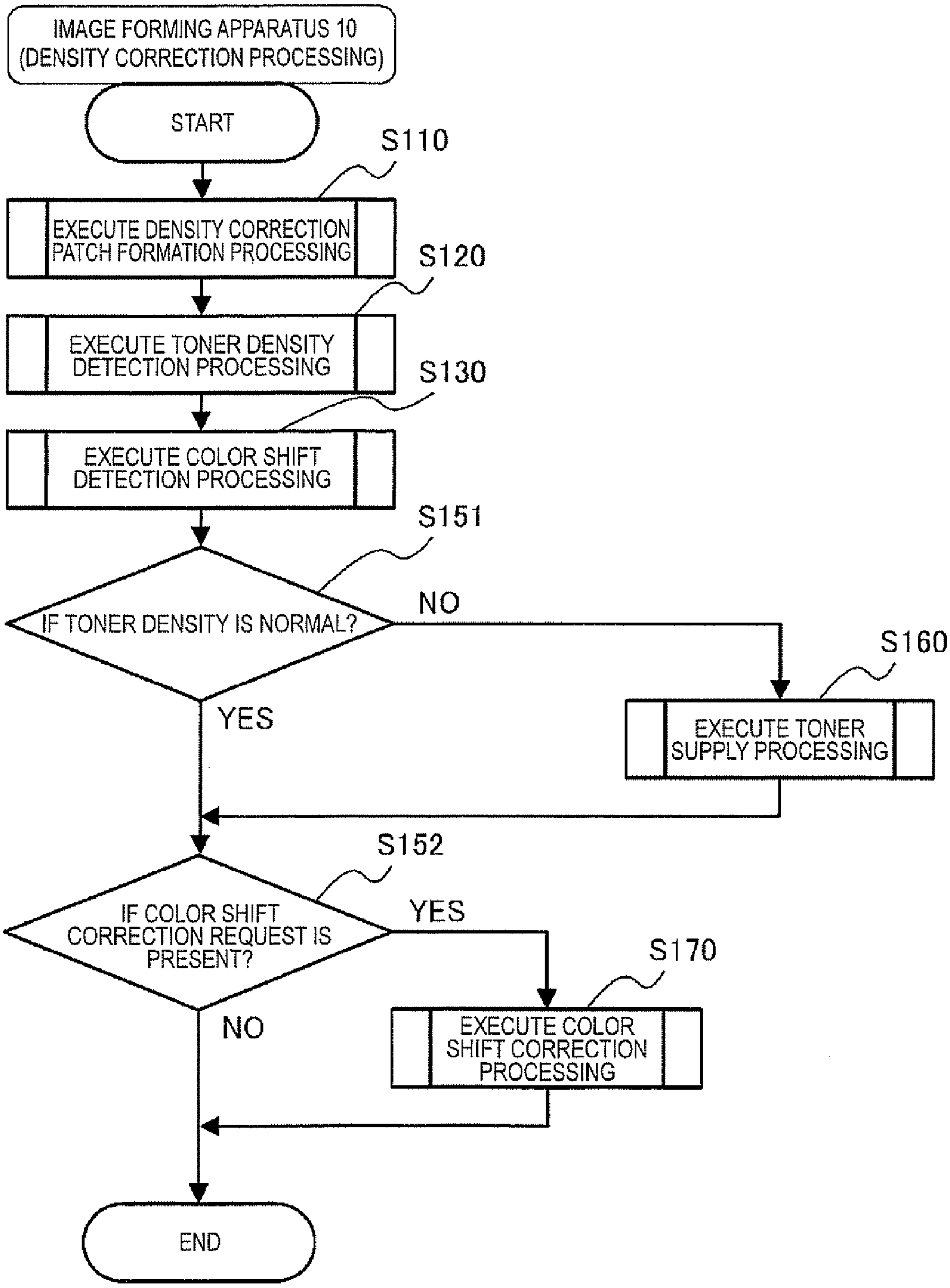
FIG. 4 is a flow chart of a density correction mode processing operation to be executed by an image forming apparatus according to an exemplary embodiment 1.

FIG. 4 is a flow chart of the processing operation of the density correction mode to be executed by the image forming apparatus 10 according to the exemplary embodiment 1.

In the image forming apparatus 10 according to the present exemplary embodiment, the control unit 16, more specifically, the density correction control unit 162 thereof, when the temperature to be detected by the temperature sensor 81 and the print volume to be detected by the print volume counting unit 82 satisfy the start conditions of the density correction mode (for example, when the print volume is 30 PV and the temperature rises by three degrees), moves to the density correction mode, where it starts such density correction control as shown in FIG. 4.

As shown in FIG. 4, when the mode moves to the density correction mode, firstly, there is carried out a processing for forming density correction patches (Step S110: a density correction patch formation processing).

FIGS. 5A to 5M show a timing chart of the density correction patch formation processing and various signals involved with a processing for detecting the densities and positions of the thus formed density correction patches.

Figures 5A, 5B, 5C, 5D, 5E, 5F, 5G, 5H, 5I, 5J, 5K, 5L, 5M:
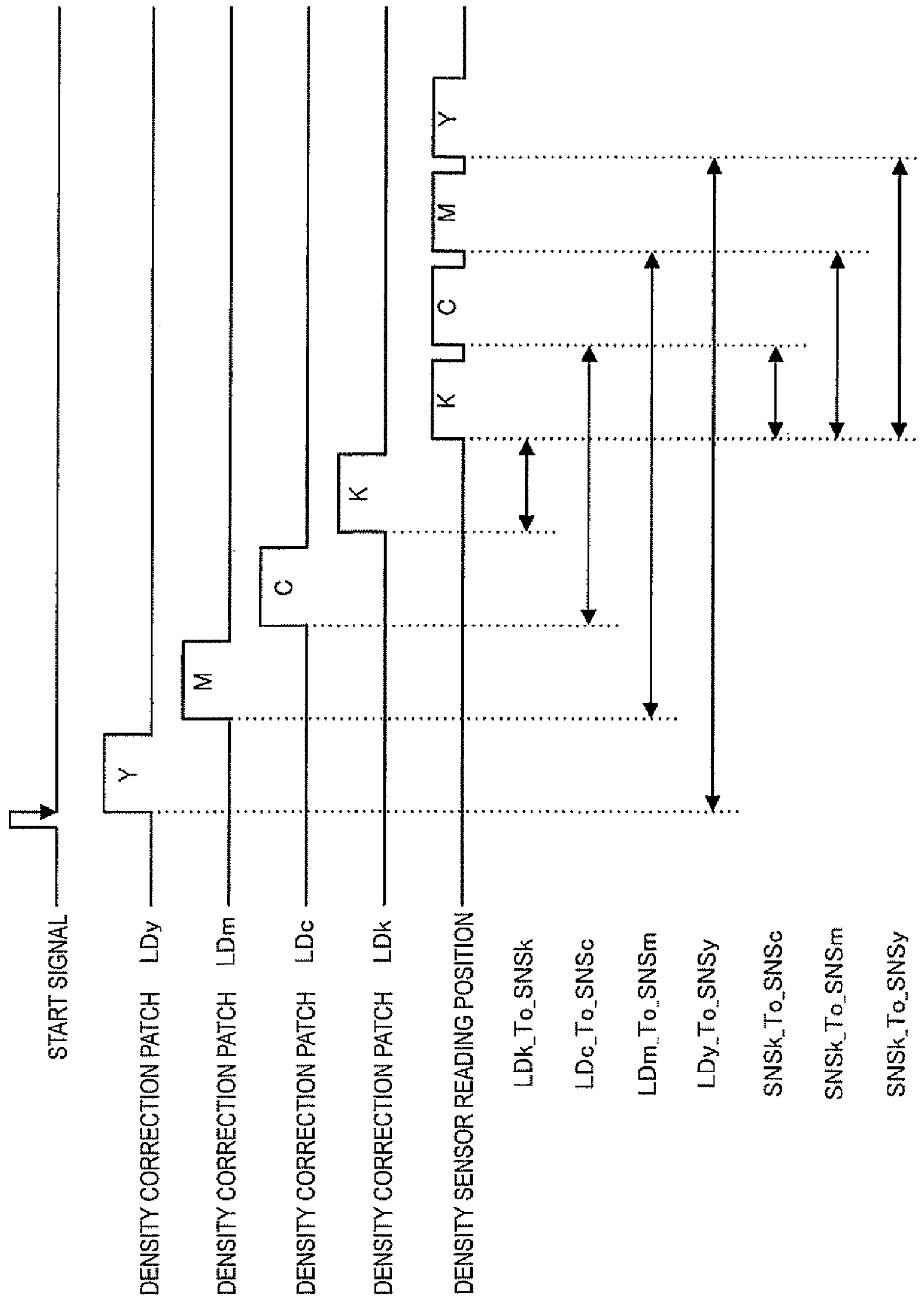
FIGS. 5A to 5M show a timing chart of various signals used in a processing to be executed in a density correction mode.

In the density correction patch formation processing to be executed in Step S110 in FIG. 4, the density correction control unit 162 starts the density correction patch formation processing according to the start signal of the density correction patch formation processing that is output when the density correction mode start condition is satisfied [see FIG. 5A]; and, the density correction control unit 162 sends density correction patch drawing instruction signals (LDy, LDm, LDc, and LDk) sequentially to the respective color image forming units 50 (50Y, 50M, 50C and 50K) at timings respectively corresponding to the color image forming units 50 (see FIGS. 5B, 5C, 5D and 5E).

The respective color image forming units 50, more specifically, the exposure units 51 thereof, according to the density correction patch drawing instruction signals, respectively expose and scan the upper surfaces of the sensitive drums 52 according to their corresponding color density correction patch data to thereby form electrostatic latent images thereon; next, the developing units 54 develop the thus formed electrostatic latent images as the toner images of the corresponding colors (density correction patches); and then, the thus developed density correction patches are transferred to the transfer belt 61 respectively.

Figure 6:
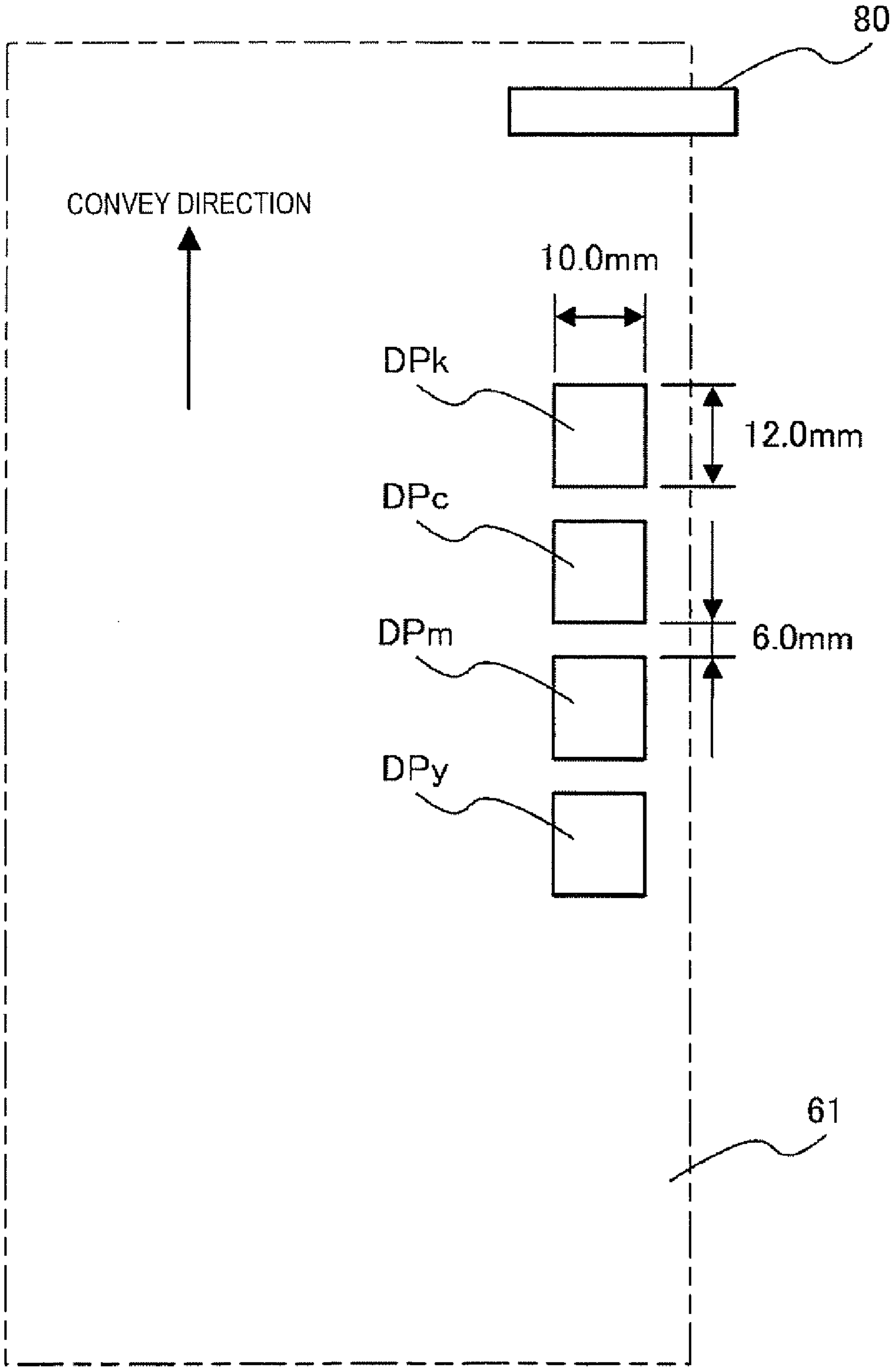
FIG. 6 is a view to show how to form a density correction patch.

Owing to this transfer processing, on the transfer belt 61, for example, as shown in FIG. 6, there are formed the respective color density correction patches DPk, DPc, DPm and DPy which are arranged along the convey direction of the transfer belt 61.

These density correction patches DPk, DPc, DPm and DPy, for example, are respectively 10 mm wide (in the width direction of the transfer belt 61) and 12 mm long (in the convey direction thereof), and they are spaced 6 mm from each other in the convey direction of the transfer belt 61.

Figure 7:
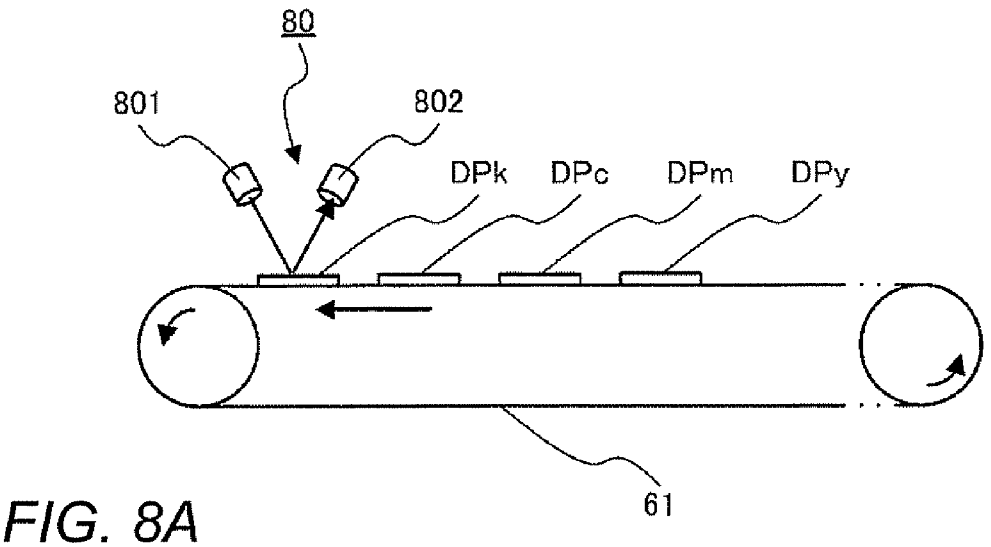
FIG. 7 is a conceptual structure view to show how a density sensor is disposed and how a density correction patch is read by the density sensor.

On the other hand, the density sensor 80, for example, as shown in FIG. 7, includes a light emitting element 801 for radiating light to the transfer belt 61 and a light receiving element 802 for receiving the light that is radiated from the light emitting element 801 and is reflected by the transfer belt 61.

The respective color density correction patches DPk, DPc, DPm and DPy, which are formed on the transfer belt 61 in the density correction patch formation processing in the above-mentioned step S110, are thereafter moved sequentially through the read position of the density sensor 80 shown in FIG. 7 to the conveying motion of the transfer belt 61.

Figure 8A:
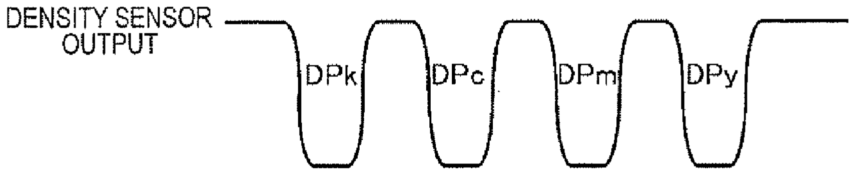
FIGS. 8A and 8B show a timing chart to show the density detection outputs of the density sensor for the density correction patches and the corresponding binary signals.

In this case, as the respective density correction patches DPk, DPc, DPm and DPy formed on the transfer belt 61 move sequentially through the read position of the density sensor 80, there are obtained such detect outputs (analog signals) as shown in FIG. 8A from the density sensor 80 (the light receiving element 802 thereof).

After the density correction patches (DPk, DPc, DPm and DPy) are formed in Step S110 shown in FIG. 4, the density correction control unit 162 detects the densities of the toners of the respective colors K, C M and Y from the detect outputs of the density sensor 80 shown in FIG. 8A, and it temporarily stores information about the thus detected respective color toner densities (Step S120: a toner density detection processing).

Figure 8B:
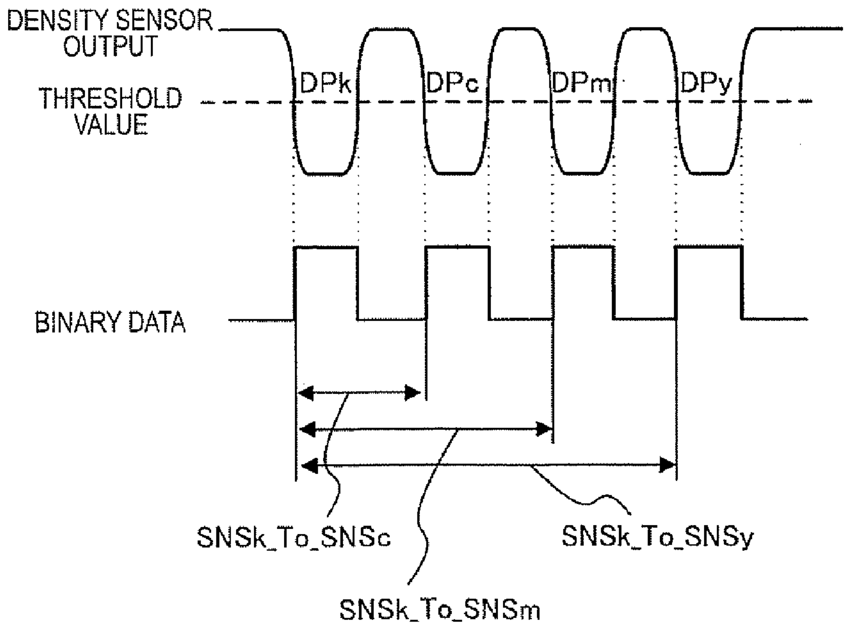

Also, the above-mentioned detect outputs (see FIG. 8A) of the density sensor 80 are taken into, for example, the binary circuit 163*e* provided in the color shift correction control unit 163; as shown in FIG. 8B, they are converted to binary values (levels) “H (high)” or “L (low) according to whether they exceed a given signal level (a threshold value) or not; and, the resultant binary values are then input to the color shift correction execution check unit 164.

The color shift correction execution check unit 164, while catching the rising timing of, for example, the “H” level, detects the positions (see FIG. 5F: the density sensor read positions) of the density correction patches DPk, DPc, DPm and DPy of the respective colors K, C, M and Y, and holds such position information.

Also, the color shift correction execution check unit 164, in the density correction patch formation processing executed in the above-mentioned step S110, takes in and holds the image drawing instruction signals (LDy, LDm, LDc and LDk) [see FIGS. 5B, 5C, 5D and 5E] of the respective color density correction patches sent out to the respective color image forming units 50.

After execution of the toner density detection processing in Step S120 shown in FIG. 4, the color shift correction execution check unit 164 carries out a color shift detection processing according to the image drawing instruction signals (LDy, LDm, LDc and LDk) and information [see FIG. 5F] about the positions of the density correction patches DPk, DPc, DPm and DPy of the respective colors K, C, M and Y (Step S130: color shift detecting processing).

Now, description will be given below of the details of the color shift detection processing in Step S130 with reference to a flow chart shown in FIG. 9.

Figure 9:
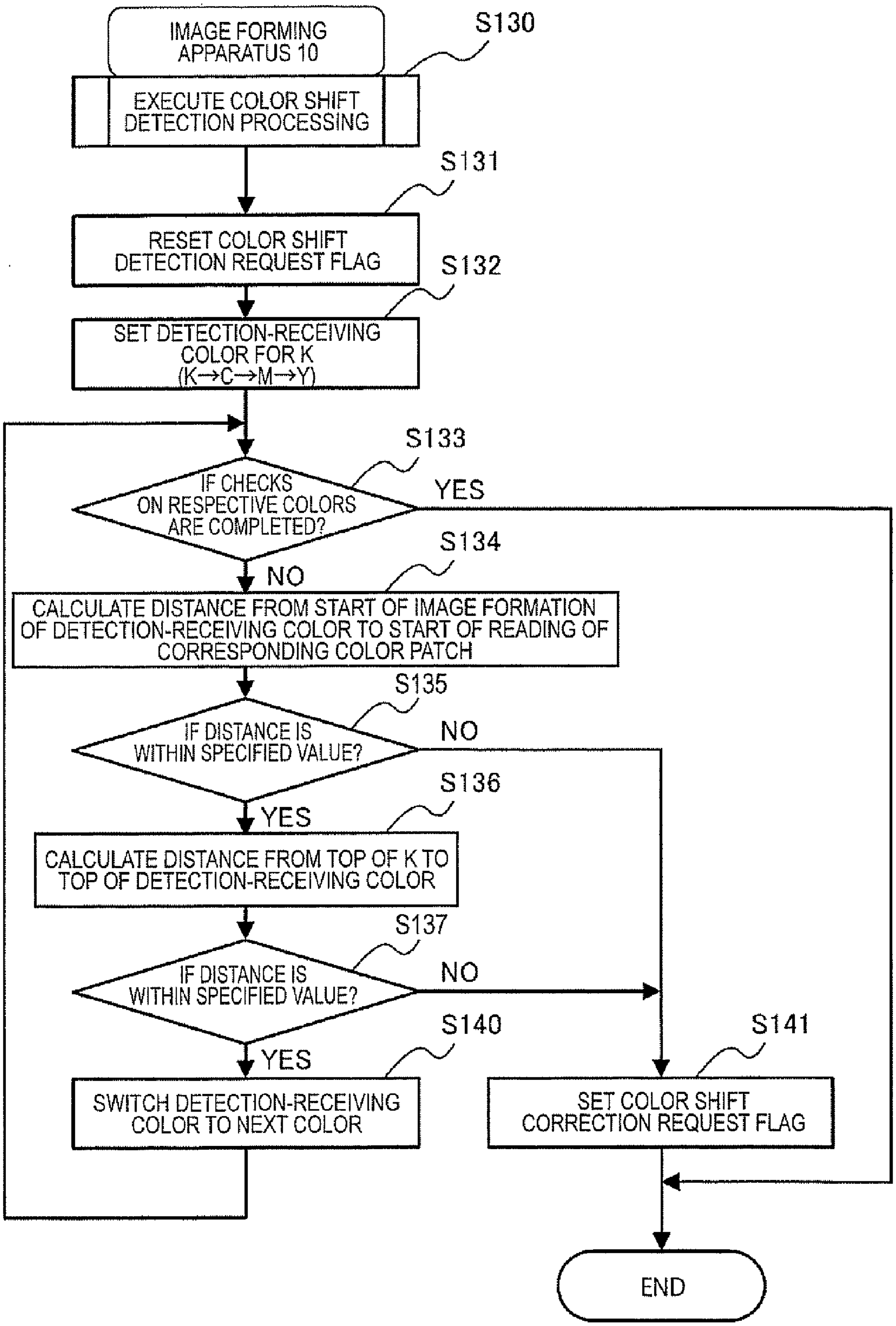
FIG. 9 is a flow chart of a color shift detection processing operation to be executed by the image forming apparatus according to the exemplary embodiment 1.

In the color shift detecting processing shown in FIG. 9, the color shift correction execution check unit 164 resets a color shift correction request flag (Step S131) and sets a color, which receives color shift correction detection, for “K” which is a first detection-receiving color (in the case where the colors are switched in order of K, C, M and Y) (Step S132).

Next, the color shift correction execution check unit 164 checks whether checks on the respective colors (K, C, M and Y) have been completed or not (Step S133). When the checks on the respective colors are not completed (one or more of the colors have not been checked) (in Step S133, no), for “K” which is a detection-receiving color, there is calculated the distance [(LDk to SNSk): see FIG. 5G] from the start of the image drawing of the density correction patch (DPk) (see FIG. 5E) to the start of the reading of the density correction patch (DPk) by the density sensor 80 (Step S134), and it is checked whether the thus calculated distance is in the range of a specified value (a previously set value) or not (Step S135).

Here, when the calculated distance [(LDk to SNSk): see FIG. 5G] is in the range of the specified value (in Step S135, yes), next, there is calculated the distance (this distance is not present actually) from the top [the rising of “K” in FIG. 5F] of the position detection result of the density correction patch (DPk) of the “K” to the top of the position detection result of the density correction patch (DPk) of the “K” which is the detection-receiving color (Step S136); and, it is checked whether the thus calculated distance is in the range of a previously set specified value or not (Step S137).

Here, when the distance from the top of the position detection result of the density correction patch (Pk) to the top of the position detection result of the density correction patch (DPk) of the “K” which is the detection-receiving color is in the range of the specified value (in Step S137, yes), the color-shift-correction-receiving color is switched "C" which is a next color (Step S140), and then the processing goes back to Step S133.

Here, when, since there exist "C", "M" and "Y" which have not been checked yet, it is determined that the checks on the respective colors are not completed (in Step S133, no), for the "C" which is a detection-receiving color, there is calculated the distance [(LDc to SNSc): see FIG. 5H] from the start of the image drawing of the density correction patch (DPc) (see FIG. 5D) to the start of the reading of the density correction patch (DPc) by the density sensor 80 (Step S134), and it is checked whether the thus calculated distance is in the range of a specified value or not (Step S135).

Here, when the calculated distance [(LDc to SNSc): see FIG. 5H] is in the range of the specified value (in Step S135, yes), next, there is calculated the distance from the top [the rising of the "K" in FIG. 5F] of the position detection result of the density correction patch (DPk) of the "K" to the top of the position detection result of the density correction patch (DPc) of the "C" which is the detection-receiving color (Step S136); and, it is checked whether the thus calculated distance is in the range of the specified value or not (Step S137).

Here, when the distance [(SNSk to SNSc): see FIG. 5K] is in the range of the specified value (in Step S137, yes), the color-shift-correction-receiving color is switched to "M" which is a next color (Step S140), and then the processing goes back to Step S133.

Here, when, since there exist "M" and "Y" which have not been checked yet, it is determined that the checks on the respective colors are not completed (in Step S133, no), for the "M" which is a detection-receiving color, there is calculated the distance [(LDm to SNSm): see FIG. 5I] from the start of the image drawing of the density correction patch (DPm) (see FIG. 5C) to the start of the reading of the density correction patch (DPm) by the density sensor 80 (Step S134), and it is checked whether the thus calculated distance is in the range of a specified value or not (Step S135).

Here, when the calculated distance [(LDm to SNSm): see FIG. 5I] is in the range of the specific value (in Step S135, yes), next, there is calculated the distance from the top [the rising of the "K" in FIG. 5F] of the position detection result of the density correction patch (DPk) of the "K" to the top of the position detection result of the density correction patch (DPm) of the "M" which is the detection-receiving color (Step S136); and, it is checked whether the thus calculated distance is in the range of the specified value or not (Step S137).

Here, when the distance [(SNSk to SNSm): see FIG. 5L] is in the range of the specific value (in Step S137, yes), the color-shift-correction-receiving color is switched to "Y" which is a next color (Step S140), and then the processing goes back to Step S133.

Here, when, since there exists "Y" which has not been checked yet, it is determined that the checks on the respective colors are not completed (in Step S133, no), for the "Y" which is a detection-receiving color, there is calculated the distance [(LDy to SNSy): see FIG. 5J] from the start of the image drawing of the density correction patch (DPy) (see FIG. 5B) to the start of the reading of the density correction patch (DPy) by the density sensor 80 (Step S134), and it is checked whether the thus calculated distance is in the range of a specified value or not (Step S135).

Here, when the calculated distance [(LDy to SNSy): see FIG. 5J] is in the range of the specified value (in Step S135, yes), next, there is calculated the distance from the top [the rising of the "K" in FIG. 5F] of the position detection result of the density correction patch (DPy) of the "Y" to the top of the position detection result of the density correction patch (DPy) of the "Y" which is the detection-receiving color (Step S136); and, it is checked whether the thus calculated distance is in the range of the specified value or not (Step S137).

Here, when the distance [(SNSk to SNSy): see FIG. 5M] is in the range of the specified value (in Step S137, yes), the color-shift-correction-receiving color is switched to a next color (in this case, "the next color" is not present) (Step S140), and then the processing goes back to Step S133.

Here, when, since there exists no color which has not been checked, it is determined that the checks on the respective colors have been completed (in Step S133, yes), the processing is ended.

By the way, in series of processings shown in FIG. 9, when, in Step S135, the distance from the start of the image drawing of the density correction patch of a detection-receiving color to the start of the reading of such density correction patch is beyond the range of the specific value (in Step S135, no), and when, in the above-mentioned step S137, the distance from the top of the position check result of the density correction patch (DPk) of the "K" to the top of the position detection result of the density correction patch of a detection-receiving color is beyond the range of the specified value (in Step S137, no), the color shift correction execution check unit 164 sets a color shift correction request flag for a value which unit that a correction request is present, and then ends the processing.

In FIG. 4, when there is ended the color shift detection processing (Step S130) which has been described in detail with reference to FIG. 9, the density correction control unit 162, according to information about the toner densities of the respective colors detected and held in the above-mentioned step S120, checks whether the toner densities of the respective colors are normal or not (Step S151).

Here, when it is determined that the toner densities of the respective colors are normal (in Step S151, yes), the color shift correction execution check unit 164 advances to Step S152.

On the other hand, when it is determined that any one of the respective color toner densities is abnormal (beyond the range of a specified value: that is, thin) (in Step S151, no), there is started a processing for supplying the toner of the relevant color to the developing unit 54 of the image forming unit of the color the toner density of which is determined abnormal (thin) (Step S160), the color shift correction execution check unit 164, while carrying out such toner supply processing, advances to Step S152.

In Step S152, the color shift correction execution check unit 164 checks whether a color shift correction request flag is set or not in the color shift detection processing in the above-mentioned step S130 (for the details of the color shift detection processing, FIG. 9 may be referred to) (Step S152).

Here, when it is found that the color shift correction request flag is not set (in Step S152, no), the color shift correction execution check unit 164 ends the processing.

On the other hand, when the color shift correction request flag is found set (in Step S152, yes), the color shift correction execution check unit 164 instructs the color shift correction control unit 163 to start a color shift correction mode; and, according to such instruction, the color shift correction control unit 163 executes the color shift correction processing (Step S170) and, after completion of the color shift correction processing, the color shift correction execution check unit 164 ends the processing.

Next, description will be given below of the color shift correction processing in Step S170.

In the image forming apparatus 10 according to the present exemplary embodiment, the color shift correction control unit 163, on receiving [through the execution instruction receiving unit 163*a* thereof (see FIG. 3) a start instruction sent from the color shift correction execution check unit 164 (more specifically, the correction execution instruction unit 164*c* thereof: see FIG. 3) when the color shift correction request flag is found set in Step S152 in FIG. 4 (in Step S152, yes), and thus executes a processing in Step S170 for forming color shift correction patches.

In this color shift correction patch forming processing, the color shift correction control unit 163 sends sequentially image drawing instruction signals corresponding to the color shift correction patches to the image forming units 50 (50Y, 50M, 50C and 50K) of the respective colors at timings respectively corresponding to the image forming units 50.

The image forming units 50 of the respective colors executes the following processings according to the above-mentioned color shift correction patch image forming instruction signals: that is, the exposure units 51 thereof expose and scan the sensitive drums 52 according to the color shift correction patch data on their corresponding colors to thereby form electrostatic latent images; and, the developing units 54 thereof develop the thus formed electrostatic latent images as the toner images (color shift correction patches) of the corresponding colors and also to transfer the thus developed color shift correction patches respectively to the transfer belt 61.

Figure 10:
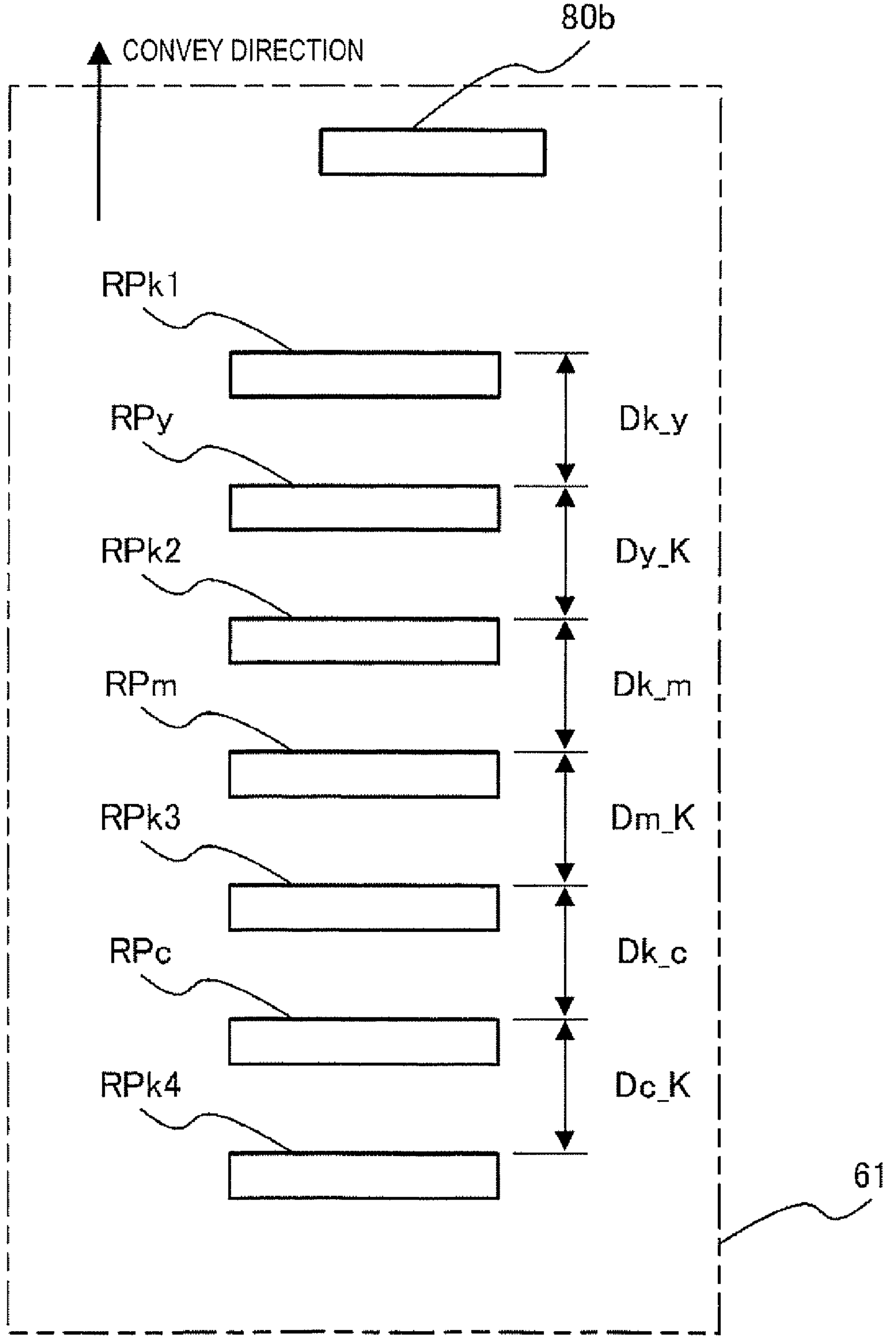
FIG. 10 is a view how a color shift correction patch is formed.

According to this transfer process, on the transfer belt 61, for example, as shown in FIG. 10, there are formed a color shift correction patch RPk1 for K, a color shift correction patch RPy for Y, a color shift correction patch RPk2 for K, a color shift correction patch RPm for M, a color shift correction patch RPk3 for K, a color shift correction patch RPc for C and a color shift correction patch RPk4 for K which are respectively arranged along the convey direction of the transfer belt 61 and are spaced by a given distance from each other.

Figure 11A:
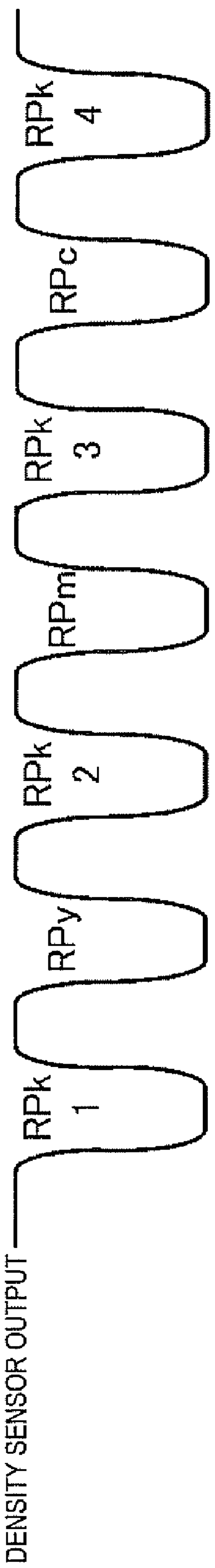
FIGS. 11A and 11B show a timing chart to show the density detection outputs of the density sensor for the color shift correction patches and the corresponding binary signals.

The color shift correction patches RPk1, RPy, RPk2, RPm, RPk3, RPc and RPk4 for the respective colors, as the transfer belt 61 is conveyed, are allowed to pass sequentially through the reading position of a density sensor 80*b* including a light emitting element and a light receiving element [alternatively, there may also be employed a structure in which the arrangement positions of the color shift correction patches are so adjusted that the above-mentioned density sensor 80 (see FIGS. 6 and 7) can be used in common]. In this case, from the light receiving element of the density sensor 80*b*, for example, there are obtained such density detection outputs (analog signals) as shown in FIG. 11A in such a manner that they are matched to the passage of the respective color shift correction patches RPk1, RPy, RPk2, RPm, RPk3, RPc and RPk4.

Figure 11B:
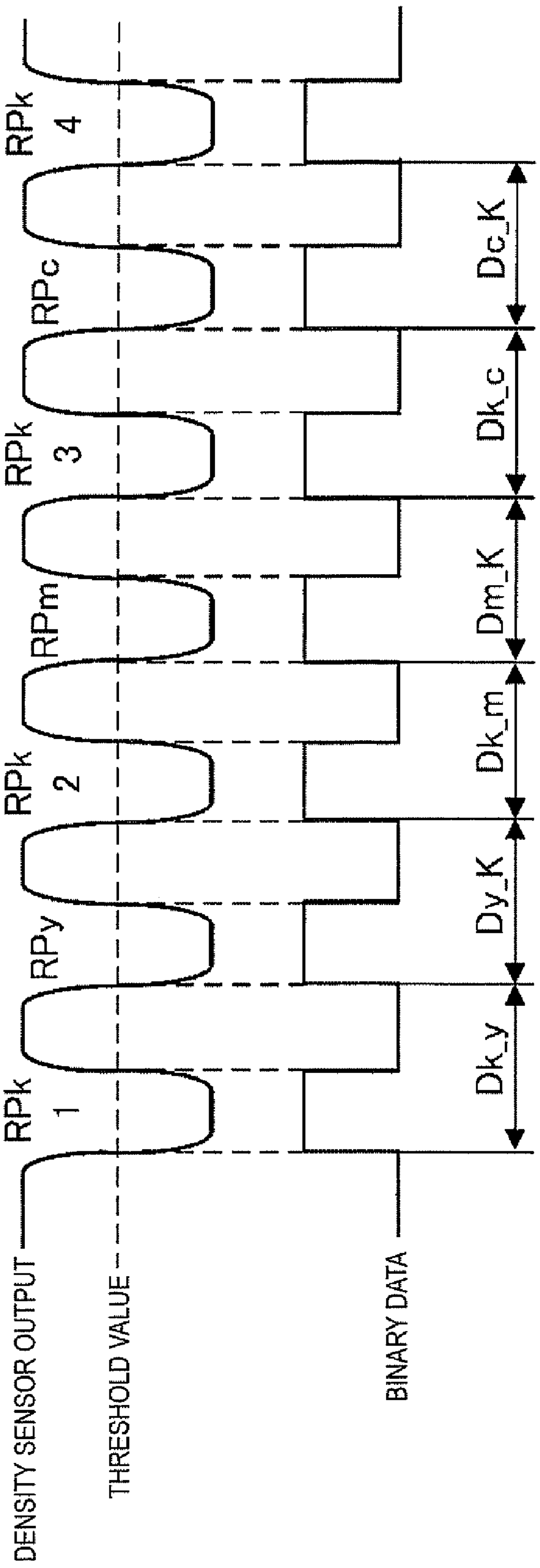

The density detection outputs of the density sensor 80*b* at the then time are converted to binary values by the binary circuit 163*e* and thus they are taken in as such binary signals as shown in FIG. 11B.

The color shift correction control unit 163 catches, for example, the "H" level rising timings of the thus input binary signals to detect the reading positions of the respective color patches RPk1, RPy, RPk2, RPm, RPk3, RPc and RPk4 and, according to the detection results, calculates the distance (Dk_y) between the color shift correction patches RPk1 and RPy, the distance (Dy_k) between the color shift correction patches RPy and RPk2, the distance (Dk_m) between the color shift correction patches RPk2 and RPm, the distance (Dm_k) between the color shift correction patches RPm and RPk3, the distance (Dk_c) between the color shift correction patches RPk3 and RPc, and the distance (Dc_k) between the color shift correction patches RPc and RPk4, respectively.

Next, the thus calculated distances of the respective color shift correction patches [(Dk_y), (Dy_k), (Dk_m), (Dm_k), (Dk_c) and (Dc_k)] are compared with a previously set distance (a reference value) between the respective color shift correction patches. When there is detected a color shift correction patch which is shifted by a given distance from the reference value, there is executed a color shift correction processing on the color for which the color shift is detected.

As an example of this color shift correction processing, there is executed a processing for adjusting the angle of the exposure system of the exposure unit 51 of the image forming unit 50 that corresponds to the color for which the color shift is detected.

Here, in the present exemplary embodiment, there is illustrated a method in which the calculated distances of the respective color shift correction patches [(Dk_y), (Dy_k), (Dk_m), (Dm_k), (Dk_c) and (Dc_k] are compared with a reference value (distance) between the respective color shift correction patches to thereby detect [for example, the shift amount of Dy=(Dk_y)−(Dk_y): reference value] color shift. However, this is not limitative but the calculated distances of the respective color shift correction patches may also be compared with ½ of the distance between the black color shift correction patches (RPk) to thereby detect [for example, the shift amount of Dy=(Dk_y)−(Dk_y)+(Dk_y)/2].

As has been described heretofore with reference to FIGS. 4 to 11, in the image forming apparatus 10 according to the present exemplary embodiment, as the density correction control unit 162 starts the density correction mode according to the print volume or the like to carry out the density correction processing, the color shift correction execution check unit 164, in the execution of the density correction mode, checks whether the color shift correction mode should be executed or not using the density correction patches of the respective colors to be formed on the transfer belt 61; and, according to a start instruction which is issued when it is determined that the color shift correction mode is to be executed, the color shift correction control unit 163 forms the color shift correction patches of the respective colors on the transfer belt 61 and, when any color shift is detected, the color shift correction control unit 163 carries out a processing for correcting the thus detected color shift.

Figure 12:
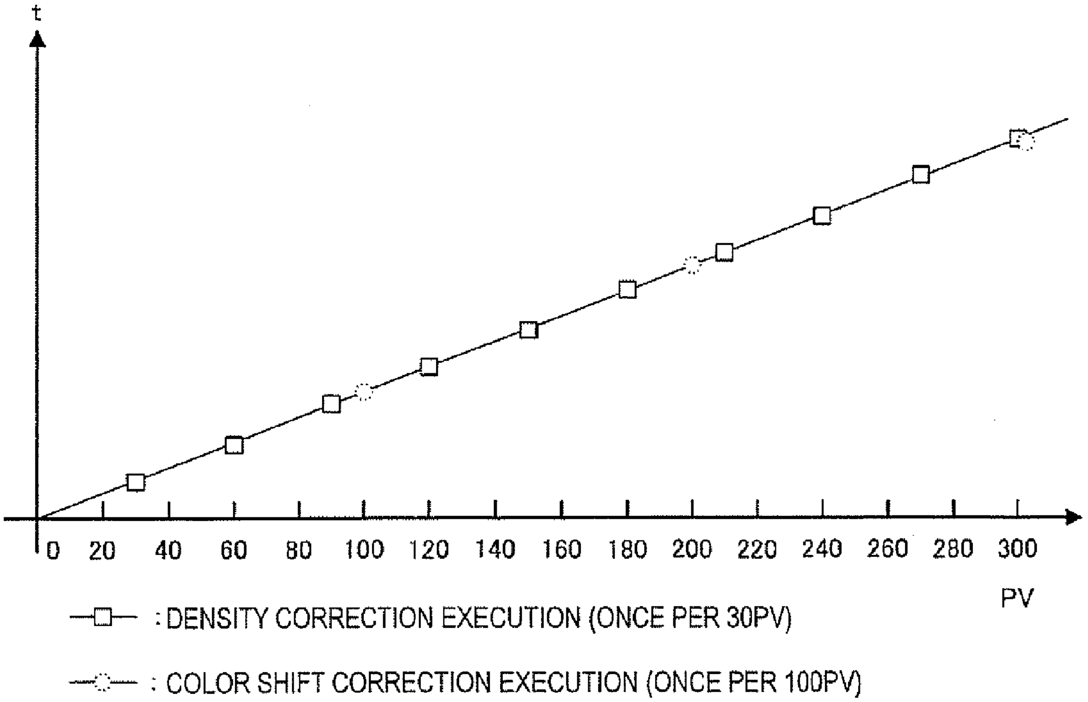
FIG. 12 is a characteristic view of time to print volume, explaining the execution intervals of the density correction control.

Owing to such processings, in the image forming apparatus 10 according to the present exemplary embodiment, for the density correction mode, similarly to an existing apparatus, for example, as shown by solid line square marks in the characteristic view of time to print volume in FIG. 12, the density correction mode is executed periodically at a rate of once per 30 PV according to the print volume. Alternatively, with the above as the base, the density correction mode may also be carried out also when the temperature of the apparatus varies by a given amount from the set temperature.

On the other hand, for the color shift correction mode, in an existing image forming apparatus, as shown by dotted-line round marks in FIG. 12, the color shift correction mode is executed, for example, once per 100 PV. However, in the image forming apparatus 10 according to the present exemplary embodiment, using the density correction patches that are used in the density correction mode, it is checked whether the color shift correction should be executed or not and, only when it is determined that the color shift correction mode should be executed, the color shift correction mode may be executed. Therefore, when compared with the existing image forming apparatus, the number of times of execution of the color shift correction mode can be reduced greatly.

Also, since, using the density correction patches that are formed in the density correction mode, it is checked whether the color shift correction mode should be executed or not, there is eliminated the need to form patches separately for confirmation of the color shift. This, in combination with the reduced number of times of execution of the color shift correction processing, can reduce the consumption of toners.

Also, according to the present exemplary embodiment, since the color shift correction processing is carried out after execution of the density correction processing, the color shift correction processing can be executed accurately in a state where the toner density is stable.

Next, description will be given below of exemplary embodiments 2 to 5.

Here, image forming apparatus according to the exemplary embodiments 2 to 5 are respectively similar in the structures of the function blocks thereof to the image forming apparatus 10 according to the exemplary embodiment 1, but they are respectively different in the flows of the density correction mode processing operations thereof from the image forming apparatus 10 according to the exemplary embodiment 1.

Exemplary Embodiment 2

Figure 13:
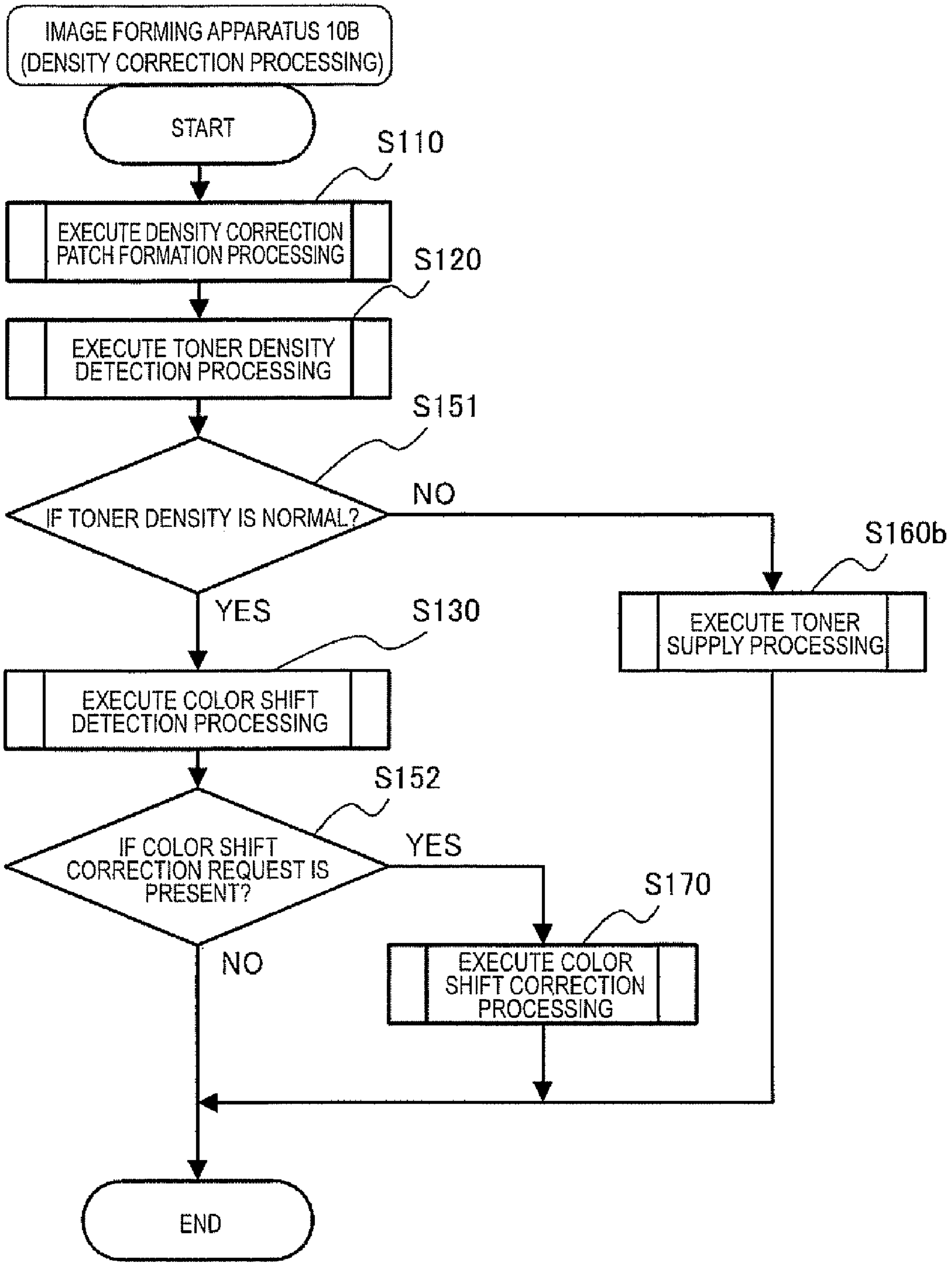
FIG. 13 is a flow chart of a density correction mode processing operation to be executed by an image forming apparatus according to an exemplary embodiment 2.

FIG. 13 is a flow chart of the processing operation of a density correction mode used in an image forming apparatus (which is designated by 10B for convenience) according to the exemplary embodiment 2.

In FIG. 13, the same processing steps of the present image forming apparatus as those used in the processing operations of the density correction mode according to the exemplary embodiment 1 shown in FIG. 4 are given the same designations.

In the image forming apparatus 10B according to the present exemplary embodiment, as shown in FIG. 13, in the operation of the density correction mode, there is executed a processing for forming the density correction patches of the respective colors (Step S110), and there is executed a processing for detecting the densities of the density correction patches of the respective colors (Step S120). After then, the density correction control unit 162, according to information about the toner densities of the respective colors detected and held in the above step S120, checks whether the toner densities of the respective colors are normal or not (Step S151).

Here, when it is determined that the respective color toner densities are normal (in Step S151, yes), the color shift correction execution check unit 164, as shown in detail in FIG. 9, carries out a color shift detection processing for setting a color shift correction request flag when a color shift is detected according to the distance from the start of the image drawing of the respective color density correction patches to the detection of the positions of the respective color density correction patches and the distance between the respective color density correction patches (Step S130).

After execution of this color shift detection processing, when it is determined that the color shift request flag is set (in Step S152, yes), there is given an instruction to the color shift correction control unit 163 to execute a color shift correction mode; and, on receiving such instruction, the color shift correction control unit 163 forms color shift correction patches according to the above-mentioned method and, when any color shift is detected, it corrects the color shift detected (Step S170).

On the other hand, when it is determined that any one of the colors is abnormal (thin) in the toner density (in Step S151, no), the density correction control unit 162 starts a processing for supplying the toner of the color, the toner density of which is determined thin, to the developing unit 54 of the image forming unit 50 corresponding to such color (Step S160*b*) and, when such toner supply processing is completed, it ends the processing.

In this manner, in the exemplary embodiment 2, as the result of execution of the density correction mode, when it is determined that the toner density is abnormal (thin), a color shift detection processing and a color shift correction execution check processing, both of which are to be executed in the color shift correction execution check unit 164 using density correction patches, are not executed (are prohibited), but only the toner supply processing, which is the density correction processing, is to be executed.

To realize the above-mentioned prohibition function of prohibiting the execution of the color shift correction execution check processing by the color shift correction execution check unit 164 when the abnormal toner density is detected using the density correction patches in the density correction mode, there may be provided, for example, in the density correction control unit 162, a control function such as a function of instructing the color shift correction execution check unit 164 not to execute the above processing when the abnormal toner density is detected.

Exemplary Embodiment 3

Figure 14:
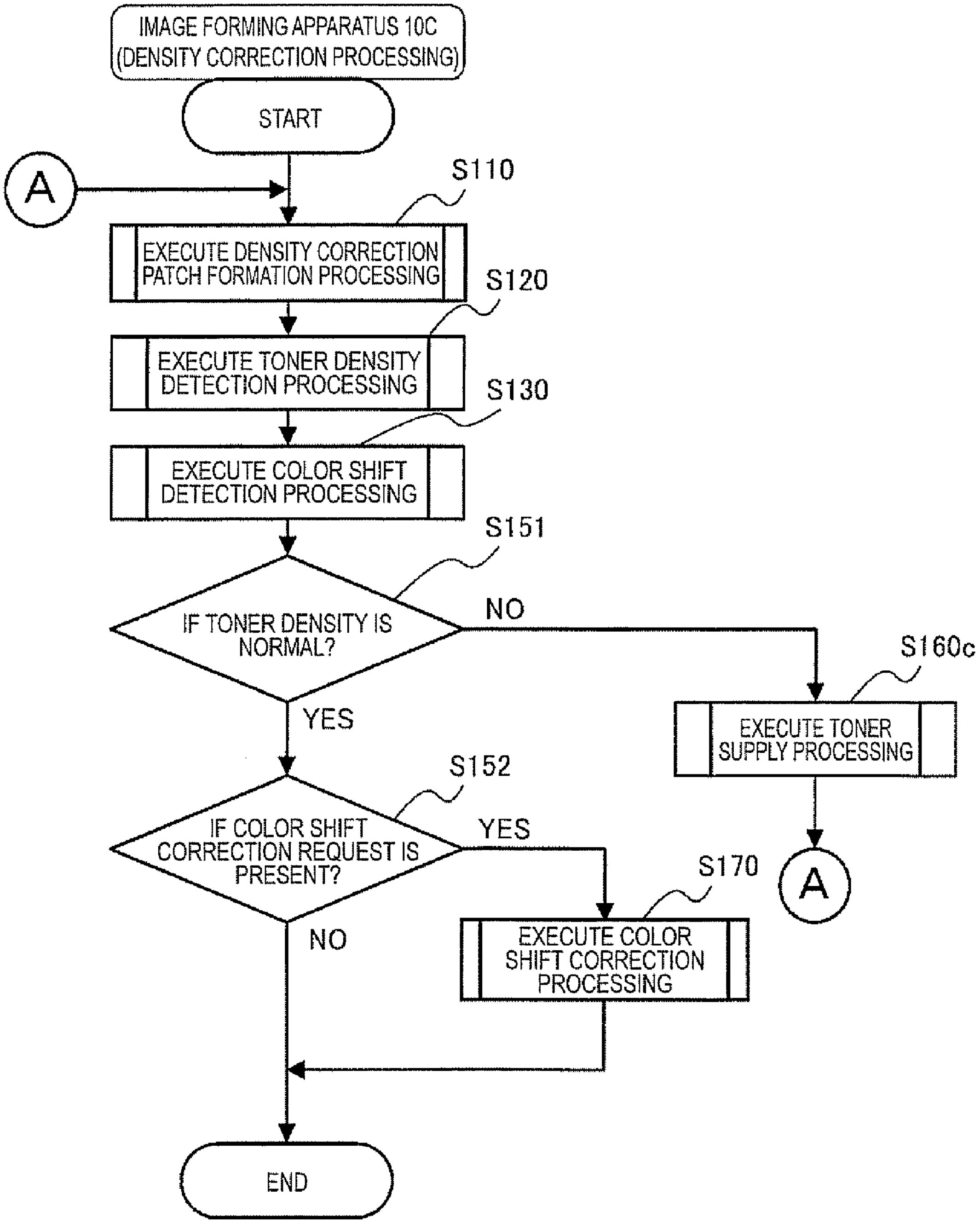
FIG. 14 is a flow chart of a density correction mode processing operation to be executed by an image forming apparatus according to an exemplary embodiment 3.

FIG. 14 is a flow chart of the processing operation of a density correction mode used in an image forming apparatus (which is designated by 10C for convenience) according to the exemplary embodiment 3.

In FIG. 14, the same processing steps of the present image forming apparatus as used in the processing operation of the density correction mode according to the exemplary embodiment 1 shown in FIG. 4 are given the same designations.

In the image forming apparatus 10C according to the present exemplary embodiment, as shown in FIG. 14, in the operation of the density correction mode, there is executed a processing for forming the density correction patches of the respective colors (Step S110) and further, there is executed a processing for detecting the densities of the density correction patches of the respective colors (Step S120). After then, there is carried out a color shift detection processing for setting a color shift correction request flag when a color shift is detected according to the distance from the start of the image drawing of the respective color density correction patches to the detection of the positions of the respective color density correction patches and the distance between the respective color density correction patches (Step S130).

Next, according to information about the toner densities of the respective colors detected and held in the above-mentioned step S120, the density correction control unit 162 checks whether the toner densities of the respective colors are normal or not (Step S151).

Here, when it is determined that the toner density is abnormal (the toner density of any one of colors is thin) (in Step S151, no), the density correction control unit 162 starts a processing for supplying the toner of the color, the toner density of which is determined thin, to the developing unit 54 of the image forming unit 50 corresponding to such color (Step S160*c*) and, when such toner supply processing is completed, there are executed again the density correction patch forming processing (Step S110), toner density detection processing (Step S120) and color shift detection processing (Step S130). After then, it is checked whether the toner densities detected in the above-mentioned step S120 are normal or not (Step S151).

Here, when it is determined that the toner densities of the respective colors are normal (in Step S151, yes), the density correction control unit 162 checks whether a color shift correction request flag is set or not in the color shift detection processing in the above-mentioned step S130 (Step S152).

Here, when it is determined that the color shift correction request flag is set (in Step S152, yes), the color shift correction control unit 163 forms color shift correction patches according to the above-mentioned method. And, when it is determined that a color shift is present, there is given an instruction to the color shift correction control unit 163 to carry out a color shift correction mode. On receiving such instruction, the color shift correction control unit 163 forms color shift correction patches according to the above-mentioned method and, when a color shift is detected, carries out a processing for correcting the detected color shift (Step S170).

In this manner, according to the exemplary embodiment 3, as the result of execution of the density correction, when it is determined that the toner density is thin, after execution of the toner supply in the density correction processing, there are executed again the density correction patch forming processing, toner density detection processing and color shift detection processing respectively.

The above-mentioned control function, which when the abnormal toner density is detected using the density correction patches in the density correction mode, after supply of the toner of the detected abnormal color, executes again the density correction patch forming processing, a processing for measuring of the relevant density correction patch and a color shift detection processing according to such density correction patch, can be provided, for example, in the density correction control unit 162.

Exemplary Embodiment 4

Figure 15:
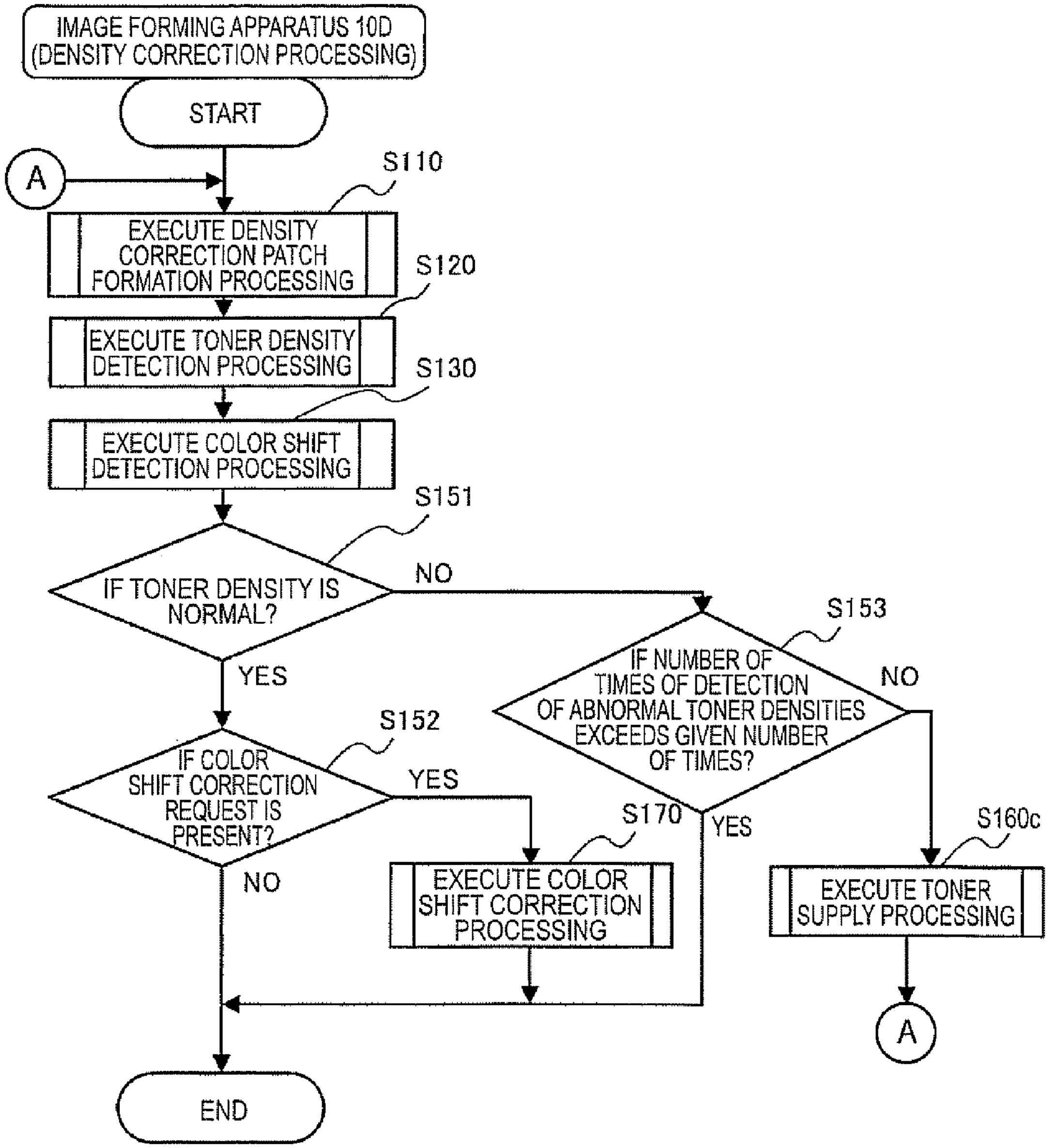
FIG. 15 is a flow chart of a density correction mode processing operation to be executed by an image forming apparatus according to an exemplary embodiment 4.

FIG. 15 is a flow chart of the processing operation of a density correction mode used in an image forming apparatus (which is designated by 10D for convenience) according to the exemplary embodiment 4.

In FIG. 15, the same processing steps thereof as those used in the processing operation of the density correction mode according to the exemplary embodiment 1 shown in FIG. 4 are given the same designations.

In the image forming apparatus 10D according to the present exemplary embodiment, as shown in FIG. 15, when a density correction mode is in operation, there is executed a processing for forming the density correction patches of the respective colors (Step S110) and further, there is executed a processing for detecting the densities of the density correction patches of the respective colors (Step S120). After then, there is carried out a color shift detection processing for setting a color shift correction request flag when a color shift is detected according to the distance from the start of the image drawing of the respective color density correction patches to the detection of the positions of the respective color density correction patches and the distance between the respective color density correction patches (Step S130).

Following the above step, according to information about the toner densities of the respective colors detected and held in the above-mentioned step S120, the density correction control unit 162 checks whether the toner densities of the respective colors are normal or not (Step S151).

Here, when it is determined that the toner density is abnormal (the toner density of any one of colors is thin) (in Step S151, no), "1" is added to the number of times of detection of abnormal toner density to thereby update the number of times of detection of the abnormal toner density. After then, it is checked whether the number of times of detection of the abnormal toner density exceeds a previously set given number of times or not (Step S153).

Here, when it is determined that the number of times of detection of the abnormal toner density is less than the given number (in Step S153, no), the density correction control unit 162 starts a processing for supplying the toner of the color, the toner density of which is determined thin, to the developing unit 54 of the image forming unit 50 corresponding to such color (Step S160*c*) and, when such toner supply processing is completed, there are executed again the density correction patch forming processing (Step S110), toner density detection processing (Step S120) and color shift detection processing (Step S130). After then, it is checked whether the toner densities detected in the above-mentioned step S120 are normal or not (Step S151).

Here, when it is determined that the toner density is abnormal (the toner density of any one of colors is thin) (in Step S151 no), if the number of times of detection of the abnormal toner density is less than the given number of times (in Step S153, no), there are carried out the processing for supplying the toner the density of which is determined thin (Step S160*c*) and the processings in Step S110 and in its following steps.

On the other hand, when the number of times of detection of the abnormal toner density till then exceeds the given number of times (in Step S153, yes), the processing is ended.

Also, when the toner densities of the respective colors are determined normal before the number of times of detection of the abnormal toner density reaches the given number of times (in Step S151, yes), the density correction control unit 162 checks whether a color shift correction request flag is set or not in the color shift detection processing in the above-mentioned step S130 (Step S152).

Here, when it is determined that the color shift correction request flag is set (in Step S152, yes), the color shift correction control unit 163 forms color shift correction patches according to the above-mentioned method. And, when it is determined that a color shift is present, there is given an instruction to the color shift correction control unit 163 to carry out a color shift correction mode. On receiving such instruction, the color shift correction control unit 163 forms color shift correction patches according to the above-mentioned method and carries out a processing in which, when any color shift is detected, the thus detected color shift is corrected (Step S170).

In this manner, according to the exemplary embodiment 4, as the result of execution of the density correction (toner supply), when it is determined that the toner density is abnormal (thin), the toner supply in the density correction processing is executed. When, even after the toner supply is executed the given number of times, the toner density is determined abnormal, execution of the color shift correction execution check processing using the density correction patches is prohibited.

The above-mentioned counting function for counting the number of times of detection of the abnormal toner density and the execution prohibiting function, in which, after execution of the density correction processing (toner supply), when the abnormal toner density is detected, if the number of times of detection of the abnormal density counted by the counting function, execution of the color shift correction execution check processing is prohibited, can be additionally provided, for example, in the density correction control unit 162.

Exemplary Embodiment 5

An image forming apparatus (which is referred to as 10E for convenience) according to the exemplary embodiment 5, for example, similarly to the exemplary embodiment 1, executes a density correction control operation according to the flow chart shown in FIG. 4.

Figure 16:
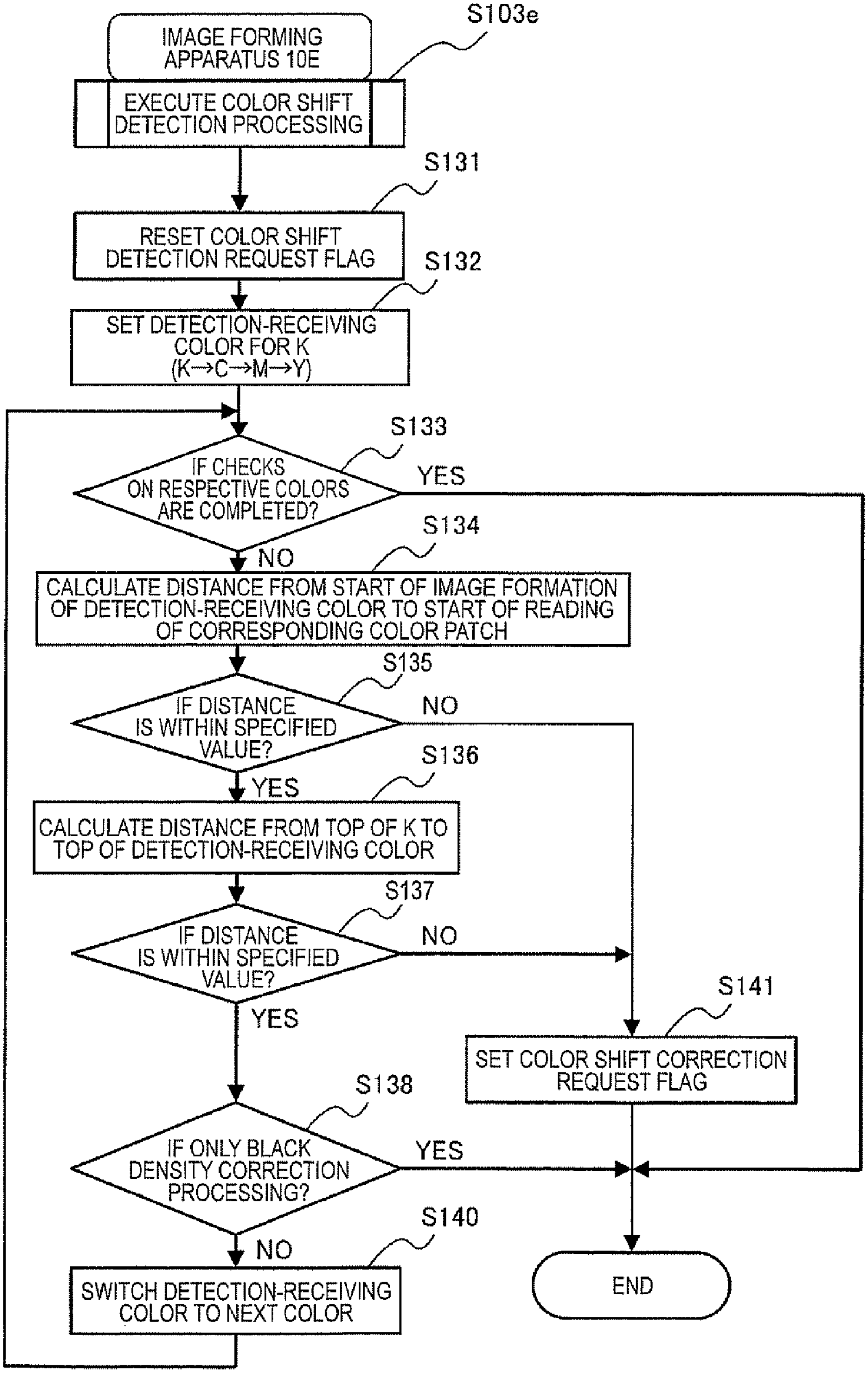
FIG. 16 is a flow chart of a color shift detection processing operation to be executed by an image forming apparatus according to an exemplary embodiment 5.

However, according to the present exemplary embodiment, in the density correction control operation shown in FIG. 4, for the color shift detection processing in Step S130, there is executed a processing operation according to a flow chart shown in FIG. 16.

The same steps as those used in the color shift detection processing according to the exemplary embodiment 1 shown in FIG. 9 are given the same designations.

As shown in FIG. 16, in the image forming apparatus 10E according to the present exemplary embodiment, of the image density correction control processing, in a color shift detection processing (which is referred to as Step S130*e* for convenience) following Step S120, there are carried out processings similar to those of the exemplary embodiment 1 in Steps 131~137 (see FIG. 9).

Of this series of processings, in Step S132, a detection-receiving color is set for "K"; in Step S134, there is calculated the distance from the start of the image formation of the density correction patch of "K" to the start of the reading of this density correction patch; and, in Step S135, it is checked whether the thus calculated distance is within the range of a specified value or not.

Here, when the distance calculated in Step S134 is within the range of the specified value (in Step S135, yes), in Step S136, there is calculated the distance (which does not exist) from the top of the position detection result of the density correction patch of "K" to the top of the position detection result of a density correction patch of the "K" that receives detection and, in Step S137, it is checked whether the thus calculated distance is within the range of a previously set specified value or not.

Here, when it is determined that the distance calculated in Step S136 is within the range of the specified value (in Step S137, yes), the color shift correction execution check unit 164 carries out a processing which is peculiar to the present exemplary embodiment, that is, a processing for checking whether the density correction is a monochrome density correction or not (Step S138).

This checking processing can be carried out, for example, by checking whether, in the density correction patch forming processing in Step S110 shown in FIG. 4, the image formation instruction signal is issued only for K or for another color as well.

Here, when it is detected that the density correction is the monochrome density correction (in Step S138, yes), the processing is ended.

In this case, the calculation of the distance from the top of the position detection of the density correction patch of K to the top of the position detection of the density correction patch of the detection-receiving color "K" in the above-mentioned step S136 is not carried out substantially. Therefore, for the distance from the start of the image drawing of the density correction patch (Pk) of the K color to the reading of the head position of the density correction patch of the color "K" which is calculated in Step S134 prior to Step S136, only when it is detected in Step S137 that the distance is not within the range of the specified value (in Step S137, no), there is set a color shift correction request flag in Step S141.

Here, when it is determined that the density correction is not the monochrome density correction (in Step S138, no), in the following processings, similarly to the exemplary embodiment 1, the color which receives detection is switched to a next color (Step S140) and there are carried out the processings in Step S133 and in the following steps thereof.

As described above, according to the present exemplary embodiment, when the density correction mode is the monochrome density correction mode, there is carried out a processing for checking whether the color shift correction processing is executed only according to the distance from the start position of the image drawing of the density correction patch of the color "K" to the reading start position of the density correction patch of the color "K" or not.

This processing function can be realized by providing in the color shift correction execution check unit 164 a mode check function for checking whether the density correction mode is a black (monochrome) density correction mode for forming only the black density correction image for density detection or not.

Further, the invention is not limited to the exemplary embodiments that have been described heretofore and shown in the accompanying drawings, but it can be enforced while it is changed properly without departing from the subject matter of the invention.

For example, in the above-mentioned exemplary embodiments, there is illustrated the example which, when measuring the position of a color shift correction patch, detects the top (the first edge) portion of each of the patches. However, the end edge of each of the patches may also be detected.

Also, multiple sets of density correction patches and color shift correction patches, which have been described in the above-mentioned exemplary embodiments, may also be arranged and formed to thereby enhance the accuracy of the density correction and color shift correction.

Also, in the above-mentioned exemplary embodiments, there is illustrated a structure example in which the toner images of the respective colors formed in the respective image forming units 50 are transferred to an image carrier and the toner images of the respective colors held by the image carrier are further transferred to a sheet to thereby form a color image thereon. However, this is not limitative but the invention can also be applied to a structure in which the toner images of the respective colors formed by their associated image forming units 50 are transferred directly onto a sheet being conveyed by a convey belt, and the density correction patches and color shift correction patches are formed on the convey belt, whereby the density correction and color shift correction are carried out.

INDUSTRIAL APPLICABILITY

The present invention can be applied to a tandem type of color image forming apparatus such as a printer and a composite machine.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An image forming apparatus, comprising:

multiple image forming units respectively that forms images of different colors;

a density correction image formation control unit that instructs the respective image forming unit to draw images for forming density correction images of the respective colors, transferring the formed density correction images of the respective colors onto an image carrier, and forming the density correction images of the respective colors on the image carrier;

a density detecting unit that detects densities of the density correction images of the respective colors formed on the image carrier;

a density correction control unit that corrects densities of images of the respective colors based on density detection outputs by the density detecting unit on the density correction images of the respective colors;

a color shift correction execution check unit that detects positions of the density correction images of the respective colors based on first binary signals of the density detection outputs by the density detecting unit on the density correction images of the respective colors, and also checks, based on the detection by the color shift correction execution check unit, whether a color shift correction processing is required to be executed or not;

a color shift correction image formation control unit that, when the color shift correction execution check unit determines that the color shift correction processing is required to be executed, that instructs the respective image forming units to draw images for forming color shift correction images of the respective colors, transferring the formed color shift correction images of the respective colors onto an image carrier, and forming the color shift correction images of the respective colors on the image carrier; and, a color shift correction control unit that detects positions of the color shift correction images of the respective colors based on second binary signals of density detection outputs by the density detecting unit on the color shift correction images of the respective colors, and also corrects color shifts based on the detection by the color shift correction control unit.

2. The image forming apparatus according to claim 1, wherein according to (i) distances corresponding to intervals of time from starts of image drawing of the density correction images of the respective colors by the respective image forming unit to the detection of the positions of the density correction images of the respective colors and (ii) the distances between the density correction images of the respective colors, the color shift correction execution check unit checks whether the color correction processing is required to be executed or not.

3. The image forming apparatus according to claim 1, further comprising:

a prohibiting unit that, when an abnormal density is detected according to the density detection outputs by the density detecting unit on the density correction images of the respective colors, prohibits the check by the color shift correction execution check unit.

4. The image forming apparatus according to claim 1, further comprising:

a control unit that, if an abnormal density is detected according to the density detection outputs by the density detecting unit on the density correction images of the respective colors, controls, after the density correction processing by the density correction control unit for correcting a density of a color with the density thereof detected abnormal and, thereafter, (i) controls the density correction image formation control unit to execute the density correction image forming processing again and also (ii) controls the color shift correction execution check unit to execute the color shift correction execution check processing again.

5. The image forming apparatus according to claim 4, further comprising:

a counting unit that counts a number of times of detection of abnormal densities; and, an execution prohibiting unit, if the abnormal density is detected after the density correction processing by the density correction control unit, when the number of times of detection of the abnormal densities counted by the counting unit exceeds a set number of times, that prohibits the color shift correction execution check processing by the color shift correction execution check unit.

6. The image forming apparatus according to claim 1, further comprising:

a check unit that checks whether the density correction processing is a black density correction processing for forming only a density correction image of black to detect the density thereof or not, wherein the color shift correction execution check unit, when the check unit determines that the density correction processing is the black density correction processing, checks whether the color shift correction processing is required to be executed only according to the distance corresponding to the interval of time from the start of image drawing of the density correction image of black formed on the image carrier in the black density correction processing to the detection of the position of the density correction image of such black or not.

* * * * *